United States Patent [19]

Masuda et al.

[11] Patent Number: 5,184,027
[45] Date of Patent: Feb. 2, 1993

[54] CLOCK SIGNAL SUPPLY SYSTEM

[75] Inventors: Noboru Masuda, Kokubunji; Ryotaro Kamikawai, Tokyo; Masayoshi Yagyu, Kokubunji; Masakazu Yamamoto; Hiroyuki Itoh, both of Kodaira; Tatsuya Saito, Kokubunji, all of Japan

[73] Assignee: Hitachi, Ltd., Tokyo, Japan

[21] Appl. No.: 688,696

[22] Filed: Apr. 22, 1991

Related U.S. Application Data

[63] Continuation of Ser. No. 152,916, Feb. 5, 1988, abandoned.

[30] Foreign Application Priority Data

| Mar. 20, 1987 | [JP] | Japan | 62-63782 |
| Jun. 8, 1987 | [JP] | Japan | 62-141459 |
| Jun. 8, 1987 | [JP] | Japan | 62-141460 |

[51] Int. Cl.⁵ ............................ H03K 5/00; H03K 5/13
[52] U.S. Cl. ..................................... 307/269; 328/63; 328/155; 307/262
[58] Field of Search ................. 307/269, 262; 328/63, 328/72, 55, 133, 155

[56] References Cited

U.S. PATENT DOCUMENTS

| 3,436,647 | 4/1969 | Gobeli et al. | 328/155 |
| 3,654,390 | 4/1972 | Puckette | 307/269 |
| 3,763,317 | 10/1973 | Coleman, Jr. et al. | 328/55 |
| 3,921,079 | 11/1975 | Heffner et al. | 307/262 |
| 3,983,498 | 9/1976 | Malek | 328/55 |
| 4,013,969 | 3/1977 | Dennison | 328/55 |
| 4,114,111 | 9/1978 | Winters | 328/155 |
| 4,165,490 | 8/1979 | Howe, Jr. et al. | |
| 4,229,824 | 10/1980 | En | 328/155 |
| 4,280,099 | 7/1981 | Rattlingourd | 307/269 |
| 4,309,649 | 1/1982 | Naito | 328/155 |
| 4,373,204 | 2/1983 | Brooks | 307/269 |
| 4,419,739 | 12/1983 | Blum | 364/900 |
| 4,461,014 | 4/1984 | Fujino | 328/155 |
| 4,495,468 | 1/1985 | Richards et al. | 328/55 |
| 4,495,473 | 1/1985 | Treise | 328/155 |
| 4,791,386 | 12/1988 | Shiga | 328/155 |
| 5,043,596 | 8/1991 | Masuda et al. | 328/155 |

FOREIGN PATENT DOCUMENTS

| 0012186 | 10/1979 | European Pat. Off. |
| 57-079537 | 5/1982 | Japan . |
| 57-85124 | 5/1982 | Japan . |
| 57-182819 | 11/1982 | Japan . |
| 59-140531 | 8/1984 | Japan . |
| 59-189425 | 10/1984 | Japan . |
| 61-39619 | 2/1986 | Japan . |
| 61-39650 | 2/1986 | Japan . |
| 61-39651 | 2/1986 | Japan . |
| 62-24240 | 10/1987 | Japan . |

OTHER PUBLICATIONS

Howe, Jr., L. D., IBM Technical Disclosure Bulletin, vol. 21, No. 3, "Automatic Clock Adjustment Mechanism", Aug. 1978, pp. 995-997.
Anceau, "A Synchronous Approach for Clocking VLSI Systems", IEEE Journal of S.S.C., vol. SC-17, No. 1, Feb. 1982, pp. 51-56.
IBM Technical Disclosure Bulletin vol. 20 No. 11B Apr. 1978 pp. 4889-4890, Garriss.
EPO Search Report EP 88101998.
IBM Tecnical Disclosure Bulletin, vol. 18, No. 6 Nov. 1975 pp. 1912-1913, Koetzle.
IBM Technical Disclosure Bulletin vol. 24, No. 2 Jul. 1981 pp. 895-897, Blum.
"Analog Data Manual 1983" Signetics, p. 11-8.

*Primary Examiner*—Timothy P. Callahan
*Attorney, Agent, or Firm*—Kenyon & Kenyon

[57] ABSTRACT

A clock signal supply system provides for automatic accurate phase adjustment of clock signals. The system includes an oscillator that produces clock signals and a reference generator that generates a reference signal that has a predetermined relationship with respect to the clock signals produced by the oscillator. At each location where the clock signal is to be received, an adjusting circuit is provided to adjust the phase of the received clock signals. Such an adjusting circuit may include a variable delay circuit which receives the clock signal and produces an output which is constituted by the clock signal having a varied delay, to the remainder of the attached circuits. Further, the output of the variable delay is fed back to a phase difference detection circuit. The reference signal is second input to the phase difference detection circuit. This phase difference detection circuit compares the difference of the reference signal and the output of the variable delay circuit and produces the control signal to the variable delay circuit which will further adjust the phase of the clock signal that is received. This adjustment is carried out at each of the locations where the clock signal is to be received, thereby providing automatic adjustment of the phase of the clock signals.

21 Claims, 34 Drawing Sheets

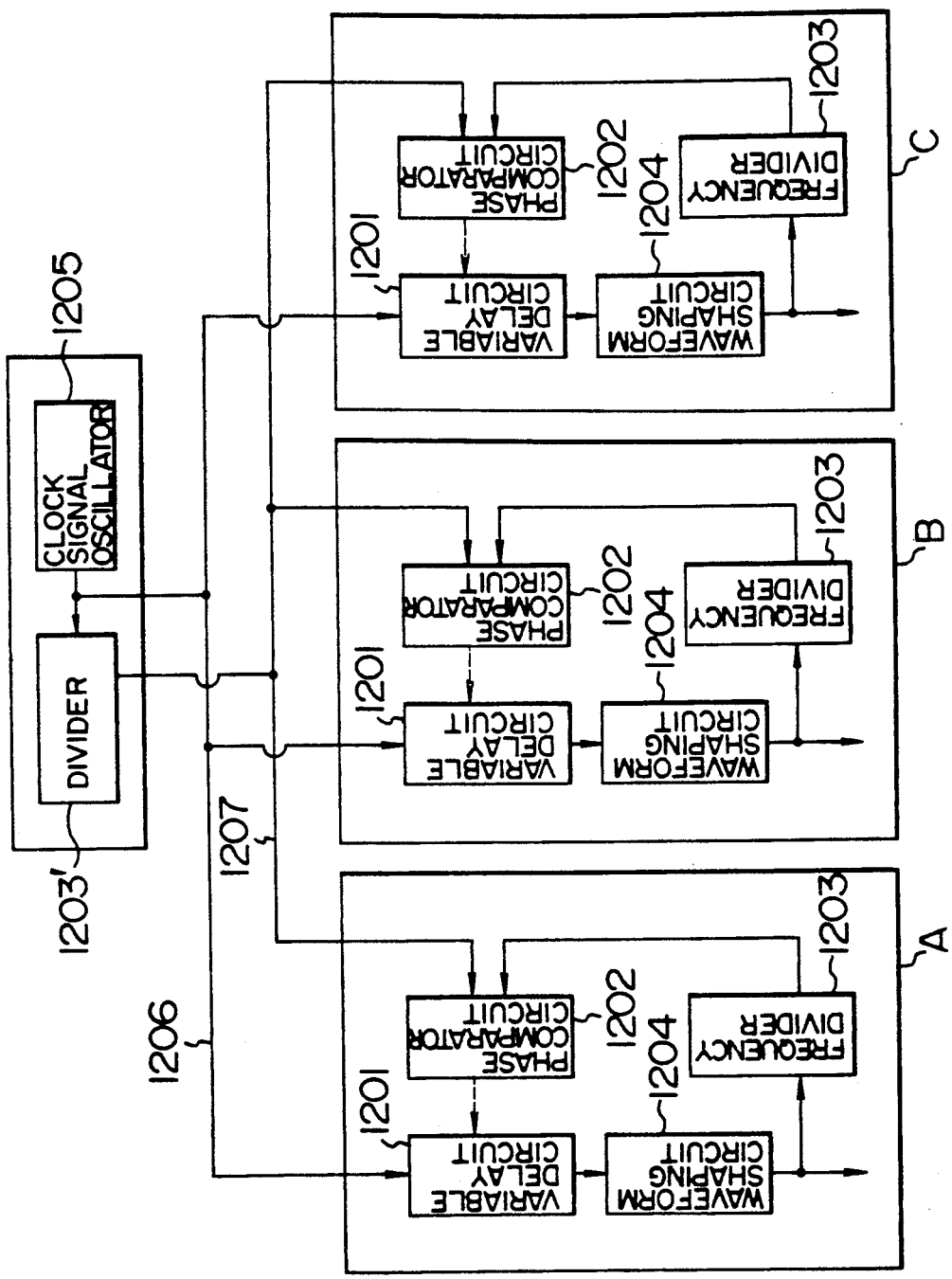

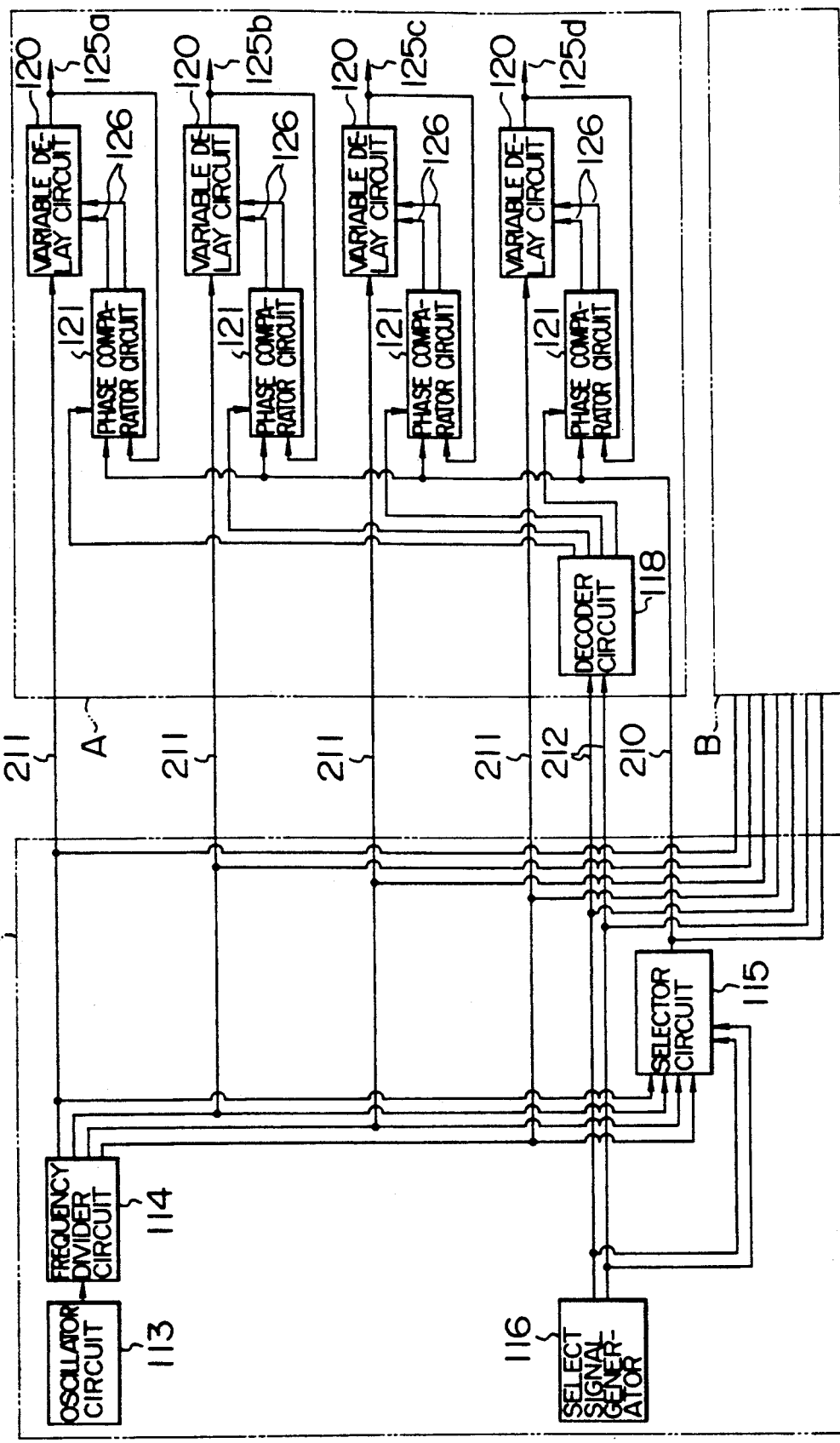
F I G. 32

F I G. 46
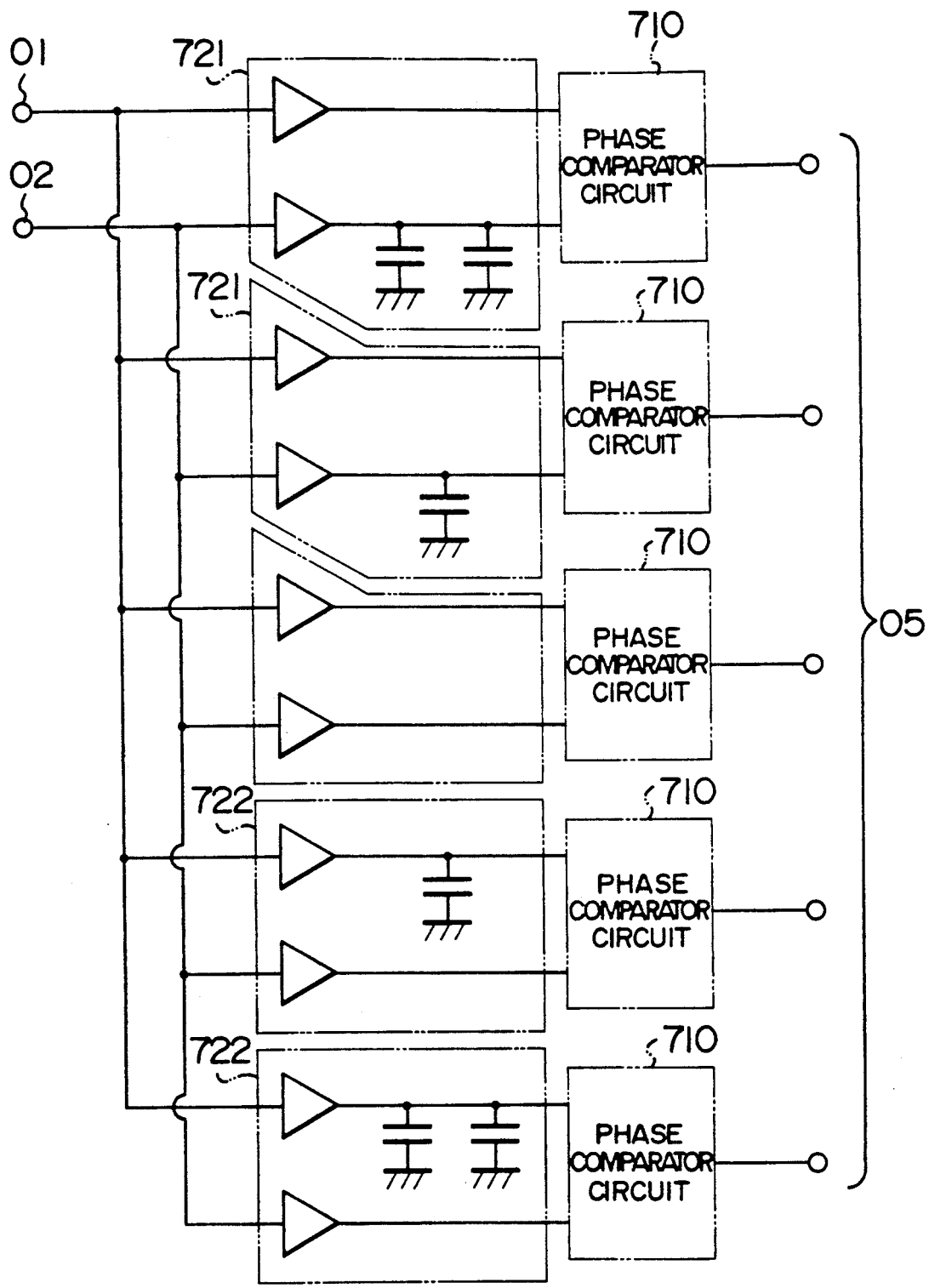

CLOCK SIGNAL SUPPLY SYSTEM

This application is a continuation of application Ser. No. 152,916 filed Feb. 5, 1988, now abandoned.

BACKGROUND OF THE INVENTION

The present invention relates to a clock signal supply system, or more in particular to a clock signal supply system suitably used with a clock supply section of a main-frame computer capable of high-speed arithmetic processing.

In a conventional method generally employed for adjusting the phase of a clock signal for a mainframe computer facing the problem of a phase shift, the waveform of the clock signal for each destination is observed manually with an oscilloscope or the like to set the phase to a predetermined value.

A method not using any oscilloscope has been disclosed, on the other hand, in JP-A-61-39619, an application for which was filed by Nippon Electric Co., Ltd. on Jul. 30, 1984, in which a clock supply circuit constitutes a ring oscillator, from the oscillation frequency of which a signal delay time of the clock supply circuit is detected to adjust the signal delay to a predetermined value.

Manual phase adjustment of a clock signal with an oscilloscope or the like requires a considerable labor and therefore is difficult to effect at a great number of points. It is thus inevitable to conduct phase adjustment at several tens to several hundreds of centralized relay points with the signal sent unadjusted to destinations at further ends. The resultant variations in signal transmission time without adjustment constitutes a limit of the clock skew reduction.

If the adjustment procedure which has thus far been handled manually is to be automated directly, it is necessary to place a probe in contact with a waveform observation point corresponding to each adjustment point sequentially, thereby requiring a mechanical positioning means for contact. In the case where a great number of adjustment points is involved, therefore, contact points would be so congested that the probe positioning procedure requires a high accuracy and rapidity, thus making the realization thereof difficult. If a signal line for the probe is installed separately for each waveform observation point, a mechanical positioning procedure would be eliminated. Such a method, however, would require that the signal transmission time for the signal lines for the probes connected to the waveform observation points all be uniform. The process of making uniform the signal transmission time for the signal lines connected to the waveform observation points requires substantially the same amount of labor as the phase asjustment of clock signals.

The method disclosed in JP-A-61-39619 described above, which also requires that all signal transmission time of the cables for returning from destinations to input points be uniform, poses the same problem as the aforementioned one after all.

Especially in a main-frame computer, the machine cycle is expected to shorten more and more with the increase in the speed of arithmetic processing. As a result, it is necessary to increase the phase adjustment points for reducing the clock skew. In view of this, the above-mentioned problem provides an important task to be overcome.

The conventional systems thus have the shortcoming that an increase in the number of phases of a clock signal leads to a proportionately increased number of adjustment points, thereby requiring an increased expenditure of labor for adjustment. On the other hand, a higher speed of a clock signal causes the rise time or fall time to approach the clock period with the result that a fall may begin before a sufficient voltage rise at the destinations of the clock signals. The clock signal amplitude is thus reduced with less noise margin, sometimes extinguishing the clock signal itself. Phase adjustment therefore becomes more difficult. This phenomenon is liable to occur especially in a long signal line between a clock source and each destination where the load or skin effect is conspicuous. In this respect, the method of adjusting the phase of a clock signal disclosed in JP-A-61-39650 and JP-A-61-39651, applications filed by Fujitsu, Ltd. in Japan on Jul. 28, 1984 and an example of a variable delay circuit disclosed in JP-A-62-24410, an application which was filed by Mitsubishi Electric Corporation on Apr. 14, 1986, do not provide sufficient means to prevent the variations in pulse duration or attenuation of the signal amplitude or extinction of the signal.

Automatic adjustment of the phase of a clock signal for a computer or the like often gives rise to a hazard or other difficulties if the control mechanism for the automatic adjustment is kept in operation. After complete adjustment, therefore, it is desirable to stop the control mechanism. In that case, however, it is difficult to compensate for a small phase shift that occurs after shut down of the control mechanism. The resulting variation, though small as compared with the phase shift to be adjusted, makes up a proportion not ignorable if the tolerance against the phase shift is reduced. In order to compensate for this, it is necessary to decide whether the phase shift is of a degree below the tolerance and, if it exceeds the tolerance, to issue an alarm signal for readjustment.

Conventional phase comparator circuits, as disclosed in Analog Data Manual (June 1983) of Signetics, for example, have only the function to decide which of two given signals is advanced but do not any function to detect the phase difference between them or to issue an alarm signal when the difference is considerable.

SUMMARY OF THE INVENTION

A first object of the present invention is to overcome the above-mentioned problems and to provide a system for automating accurate phase adjustment of clock signals.

A second object of the present invention is to reduce the number of phase adjustment of clock signals.

A third object of the present invention is to reduce the frequency of signals to be transmitted between a clock source and each destination.

A fourth object of the present invention is to provide a phase comparator circuit detect in the degree of a phase shift and issuing an alarm signal only when the phase difference is great.

A fifth object of the present invention is to provide a phase comparator circuit capable of detecting the degree of a phase shift without any visual error which is caused in the manual phase adjustment using an oscilloscope or the like.

The first object is achieved by providing means for adjusting the phase of a clock signal at each destination thereof and also a signal line for supplying each phase adjusting means with a reference signal used for phase adjustment of clock signals, separately from a signal line for supplying the clock signals.

The second object is achieved by means of causing two or more phases of clock signals to share an accurately phase-adjusted signal line by time division and setting a clock signal of each phase low in phase accuracy to a reference signal for each phase.

The third object is achieved by producing a logic sum or a logic product of multi-phase clock signals thereby to multiply frequencies for use as a clock signal.

The fourth and fifth objects are achieved by providing two types of phase comparator circuits of different threshold values against a phase difference or by changing a threshold value against a phase difference by time division.

BRIEF DESCRIPTION OF THE DRAWINGS

FIG. 12 is a diagram showing a configuration of still another embodiment of the invention.

FIGS. 29 to 32 are diagrams showing configurations of applications of the system shown in FIG. 12 respectively.

FIGS. 42 to 47 are circuit diagrams showing other embodiments of the phase difference detection circuit.

DESCRIPTION OF THE PREFERRED EMBODIMENTS

Embodiments of the present invention will be explained below with reference to the accompanying drawings.

Figure 1:
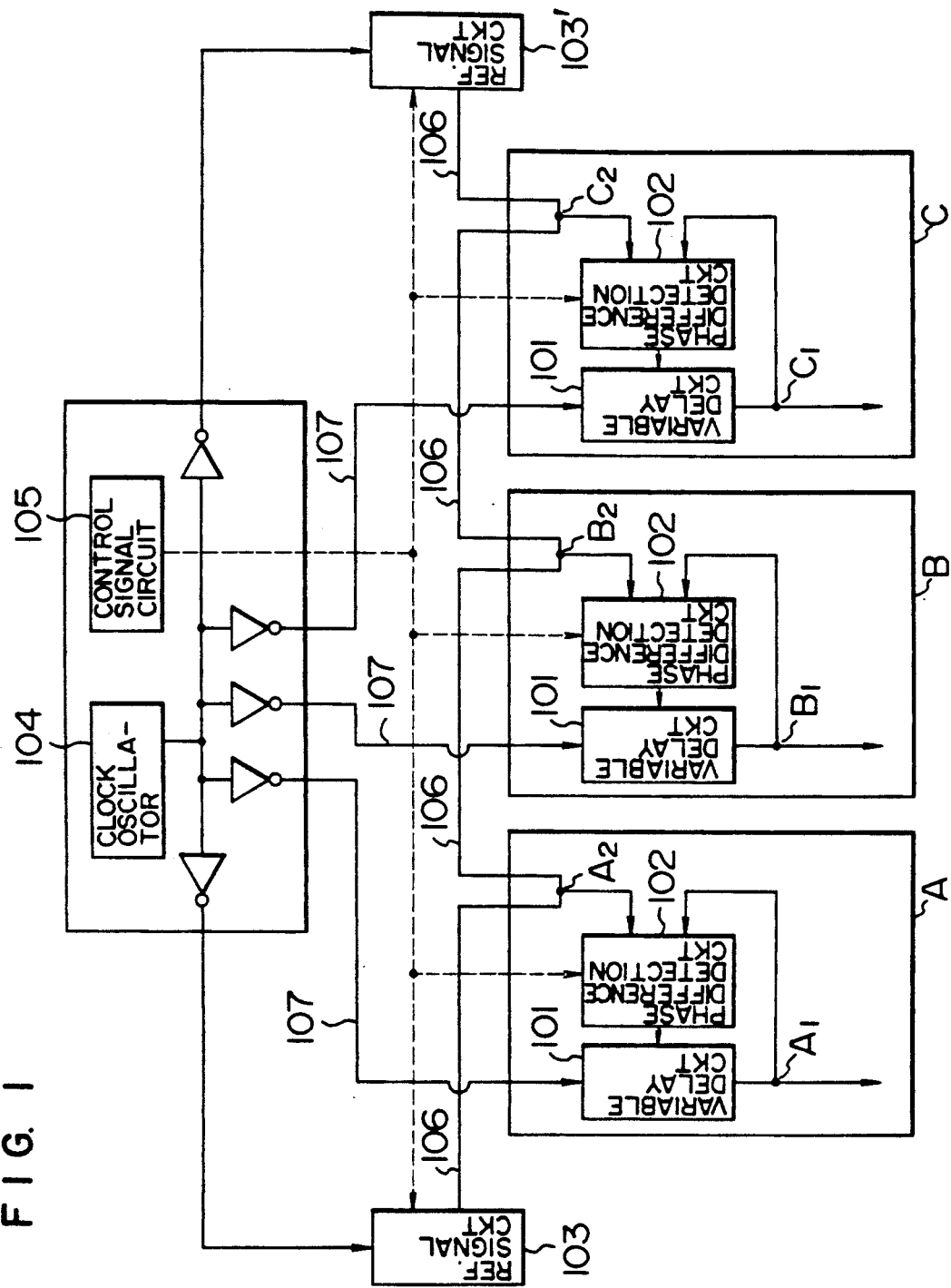
FIG. 1 is a diagram showing a configuration of a first embodiment of the present invention.

FIG. 1 shows a configuration of a first embodiment of the present invention. In FIG. 1, reference numeral 104 designates a clock oscillator, reference characters A, B and C are destinations of the clock signal, with the phase adjusting circuits shown in respective destinations A, B and C for adjusting the phase of clock signals arranged at destinations of the clock signals, numeral 107 a first signal line for supplying clock signals to the phase adjusting circuits from the clock oscillator 104, and numerals 103 and 103' reference signal generation circuits for forming a reference signal for phase adjustment. In this embodiment, the reference signal generation circuits make up a drive circuit for supplying a second signal line with clock signals generated in the clock oscillator 104. Numeral 106 designates a second signal line for supplying a reference signal to each phase adjusting circuit. When a reference signal is sent from 103 toward 103', the circuit 103 acts as a drive circuit and the circuit 103' as a matching terminal circuit. The reverse is true when a reference signal is sent from the circuit 103' toward the circuit 103. Numeral 105 designates a circuit for producing a signal to control the direction in which a reference signal is sent.

In each of the phase adjusting circuits A, B and C, numeral 102 designates a phase difference detection circuit for detecting the phase difference between a received reference signal sent through the second signal line 106 from the drive circuit 103 or 103' and a received clock signal sent through the variable delay circuit 101 of the phase adjusting circuits and feeding back the result thereof to the variable delay circuit 101. The phase difference detection circuit 102 controls the signal transmission time of the variable delay circuit 101 in such a manner that the phase difference between a clock signal and a reference signal which is sent from the circuit 103 to the circuit 103' on the bidirectional signal line 106 has the same absolute value as and is opposite in polarity to the phase difference between the clock signal and the reference signal which is sent from the circuit 103' to the circuit 103.

An arrangement is made that the signal transmission time from points $A_2$, $B_2$ and $C_2$ to each of the phase difference detection circuits 102 is negligibly short.

The signal transmission time from point $A_1$ to the phase difference detection circuit 102 is preferably equal to that from the point $A_1$ to a circuit (such as a latch circuit) using a clock signal. Because if an LSI (Large Scale Integrated Circuit) is the only destination A of a clock signal, for example, the variation in delay time of gate circuits or the like in the LSI chip is considerably small as compared with the variation between chips. Once the number of gates, load conditions and wiring length beyond the point $A_1$ are designed the same way, the signal transmission time for the parts involved can be rendered substantially equal to each other. This is also the case with the other phase adjusting circuits B and C.

Now, the operation of the circuit shown in FIG. 1 will be explained. For the sake of convenience, the time required for the clock signal generated in the clock oscillator 104 to be transmitted through the variable delay circuit 101 and points $A_1$ in the destinations A to the phase difference detection circuit 102 is expressed as Ta. In similar fashion, the signal transmission time to the phase difference detection circuit 102 through the variable delay circuit 101 and points $B_1$ $C_1$ in the destinations B and C respectively are expressed as Tb and Tc respectively. Also, the time for a clock signal generated in the clock oscillator 104 to transmit through the drive circuit 103 to point $A_2$ is expressed as $T_1$, and that for the same signal to reach point $C_2$ via the drive circuit 103' as $T_2$. As far as a passive signal line is used as the bidirectional signal line 106, on the other hand, the signal transmission time from point $A_2$ to point $B_2$ is equal to that from point $B_2$ to point $A_2$. Generally, this condition is met by a signal line comprised of such passive elements as a resistor, a capacitor, an inductance or a metal conductor. This equal signal transmission time is hereinafter referred to as Tab. In similar manner, the signal transmission time from point $B_2$ to $C_2$ is equal to that from point $C_2$ to $B_2$, which is indicated as Tbc. When a reference is sent in the direction from 103 to 103' in the drawing, the phase difference detected by the phase difference detection circuit 102 in the destination A is given as $\{Ta-T_1\}$. The phase difference with a reference signal sent in the direction from 103' to 103, on the other hand, is given as $\{Ta-(T_2+Tbc+Tab)\}$. If Ta is controlled by the variable delay circuit 101 in such a way that these two phase differences have the same absolute value and opposite signs to each other, $$\{Ta-T_1\} = -\{Ta-(T_2+Tbc+Tab)\}$$

Thus, $$Ta = \tfrac{1}{2}(T_1+Tab+Tbc+T_2) \quad (1)$$

The phase difference detected by the phase difference detection circuit 102 in the destination B is controlled at $\{Tb-(T_1+Tab)\}$ and $\{Tb-(T_2+Tbc)\}$ when a reference signal is sent from the circuit 103 to 103' and in the opposite direction thereof respectively. If the destination B also controls Tb in such a manner that these two phase differences are equal to each other in absolute value in opposite signs, $$\{Tb-(T_1+Tab)\} = -\{Tb-(T_2+Tbc)\}$$

Thus, $$Tb = \tfrac{1}{2}(T_1+Tab+Tbc+T_2) \quad (2)$$

As apparent from the equations (1) and (2), Ta coincides with Tb. This is also the case with Tc. As a result, it is possible to supply clock signals in phase to a plurality of destinations. A specific method of realizing the component parts used in the embodiment of FIG. 1 will be explained below.

FIGS. 2 to 5 show some examples of the variable delay circuit 101 in FIG. 1.

Figure 2:
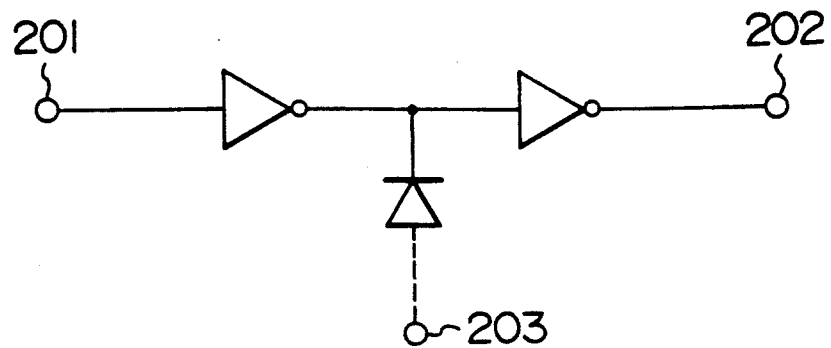
FIGS. 2 to 6, 8 and 9 are diagrams showing component elements of the first embodiment in detail.

In the circuit of FIG. 2, the delay time is controlled by changing the load capacity connected to the output of the left gate circuit (left inverter) according to the control voltage applied to a control terminal 203 by taking advantage of the fact that the coupling capacity of a diode changes with the applied voltage.

Figure 3:
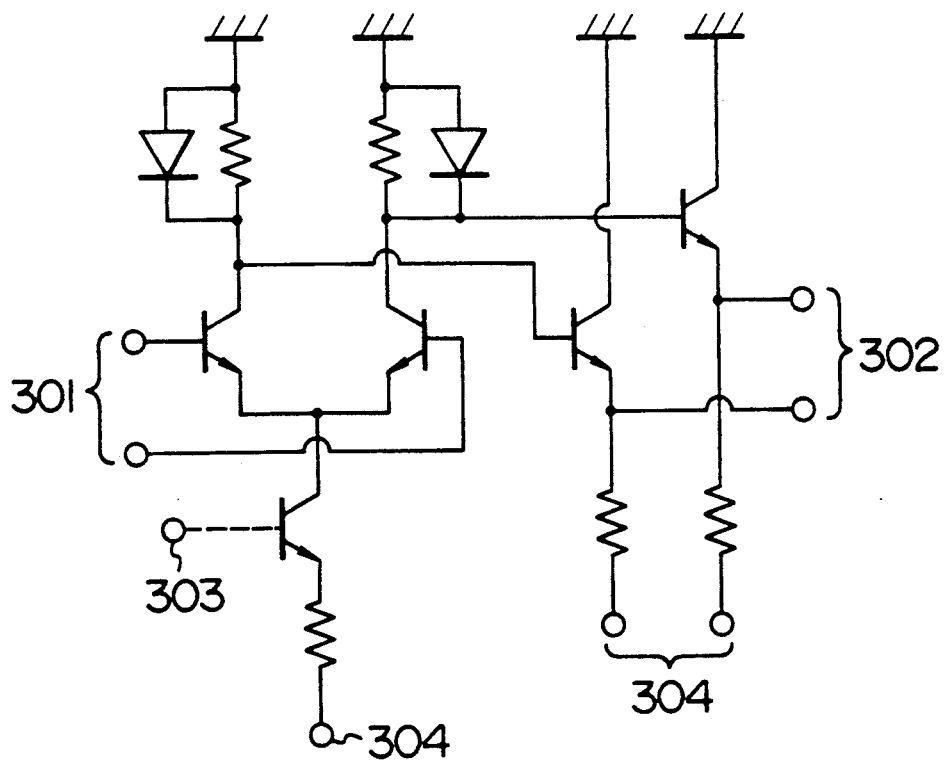
Figure 4:
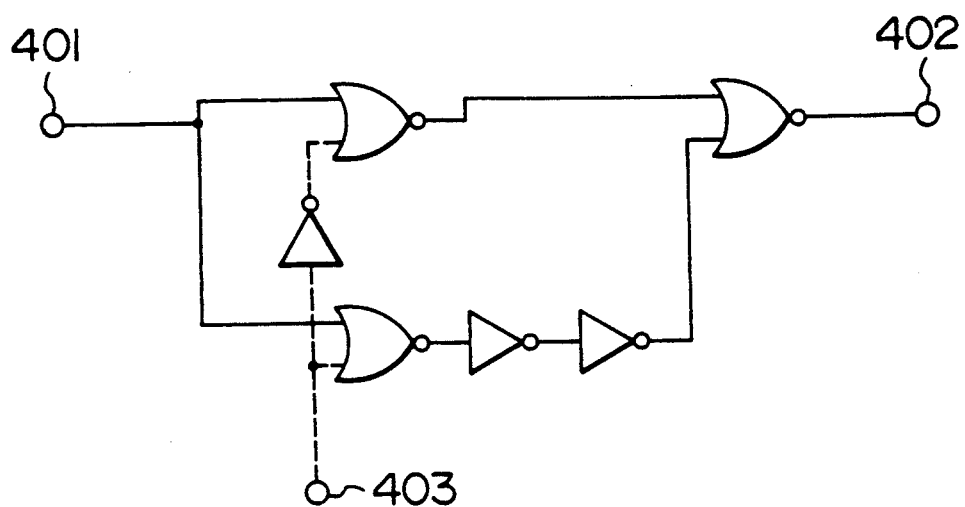
Figure 5:
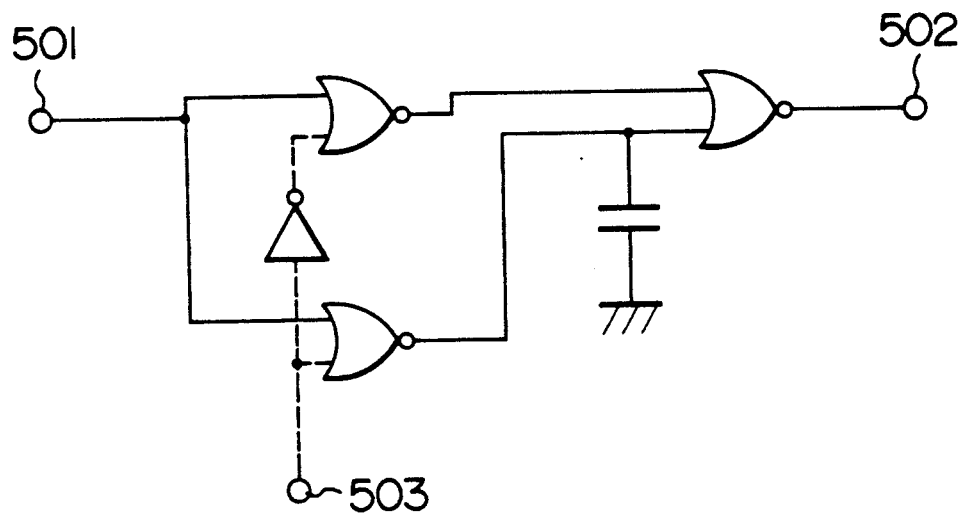

FIG. 3, on the other hand, shows a circuit in which a current flowing in a differential circuit is controlled by changing the control voltage 303 and the current for charging a coupling capacitance of a clamping diode is adjusted thereby to control and produce at 302 the delay time of an input signal. The terminal 304 is connected to a power supply. This circuit is used with a differential signal applied to the input terminals 301 or an intermediate-level voltage applied to one of the input terminals 301. This circuit is capable of controlling the delay time at the time of fall but not virtually that at the time of rise. If the output is not used in differential way, therefore, the pulse duration changes. In order to avoid this inconvenience, the circuit of FIG. 2 may be used in double stages. The circuits shown in FIGS. 4 and 5 are variable delay circuits of digital control type in which the delay time depends on whether the signal is passed through the upper or lower line. These circuits cannot be continuously controlled unlike the analog control type of circuits shown in FIGS. 2 and 3, but are easily used to increase the variable amount of delay time. Especially, the circuit of FIG. 4 has the advantage that the pulse form remains unchanged substantially with the increase in the change of the delay time. If a variable delay circuit used with the present invention is to be configured only of a circuit of digital control type, it is necessary to connect several circuits of different changes in delay time in multiple stages. It is also possible to use a circuit of digital control type and one of analog control type in combination.

In the case where a variable delay circuit of digital control type is used as shown in FIGS. 4 and 5, what is called the "hazard" is liable to occur in switching the delay time. This can be prevented by a method in which the timing of switching the delay time is synchronized with the input signal of this circuit so that the output signal remains unchanged even after switching. Another preventive method is by turning off the operation of the control system to prevent the delay time from changing after phase adjustment is complete. These two methods may of course be used in combination.

Figure 6:
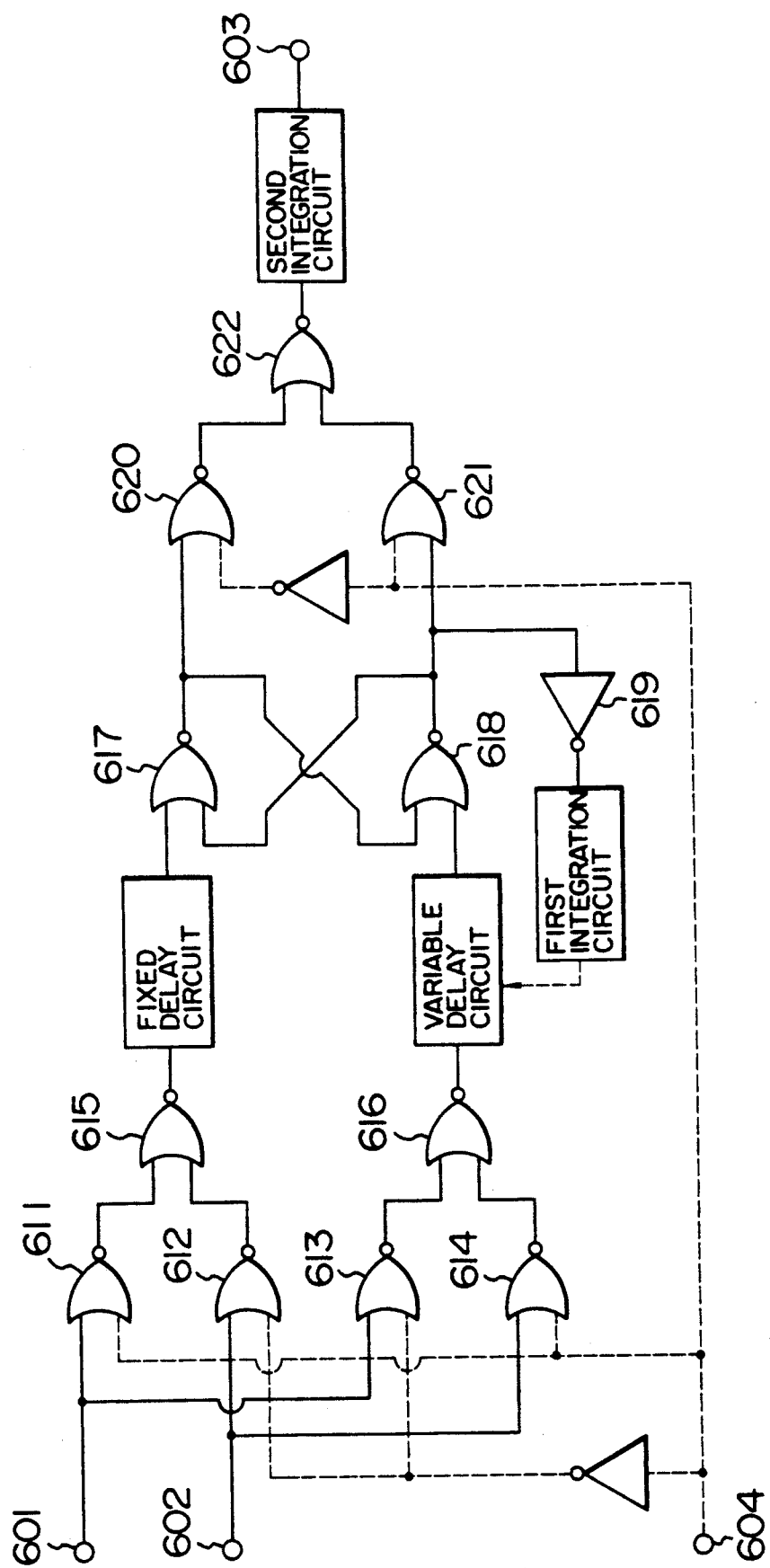

Now, an example of the method of configuring the phase difference detection circuit 102 shown in FIG. 1 is illustrated in FIG. 6. A clock signal the phase of which is to be adjusted is applied to one of the input terminals 601 and 602 of the circuit and a reference signal to the other input terminal thereof. The control terminal 604 is impressed with a "high" or "low" signal from the control signal generation circuit 105 depending on the direction in which a reference signal is sent. Also, the output terminal 603 is connected to the control terminal of the variable delay circuit 101 shown in FIG. 1. First and second integration circuits are such that the output voltage thereof slowly decreases in response to a "low" signal input and slowly increases in response to a "high" input signal. The time constant of these integration circuits is set to a value sufficiently large as compared with the period of the clock signal. As described later, the first and second integration circuits are designed preferably to have the same characteristics. The variable delay circuit shown in FIG. 6, which is separately arranged from the variable delay circuit 101 in FIG. 1, may be constructed the same way as the latter. The variable delay circuit under consideration is also designed preferably to have the same characteristics as the variable delay circuit 101 as explained later. A fixed delay circuit is for striking a balance with the signal transmission time of one variable delay circuit, and may be eliminated. This circuit is realized simply by connecting several stages of gate circuits. Now, let us consider a case in which the circuit shown in FIG. 6 is used in the destination A shown in FIG. 1.

Figure 7A:
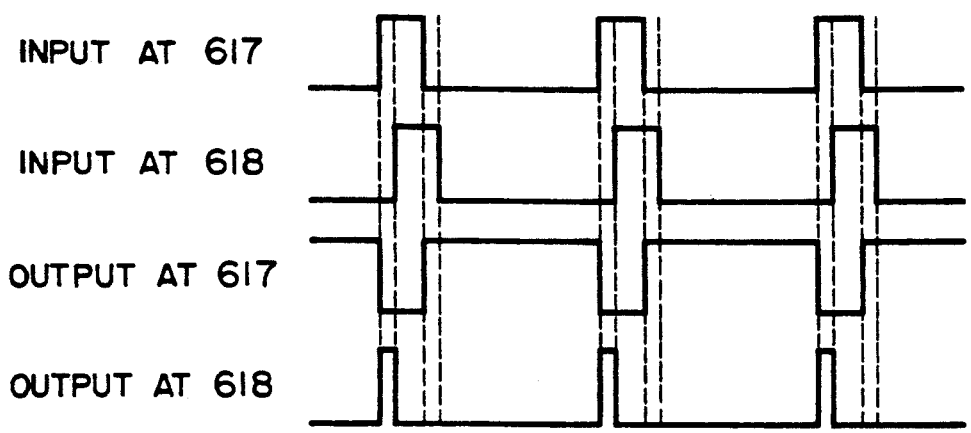
FIGS. 7A and 7B are diagrams showing waveforms for explaining the operation of the circuit shown in FIG. 6.
Figure 7B:
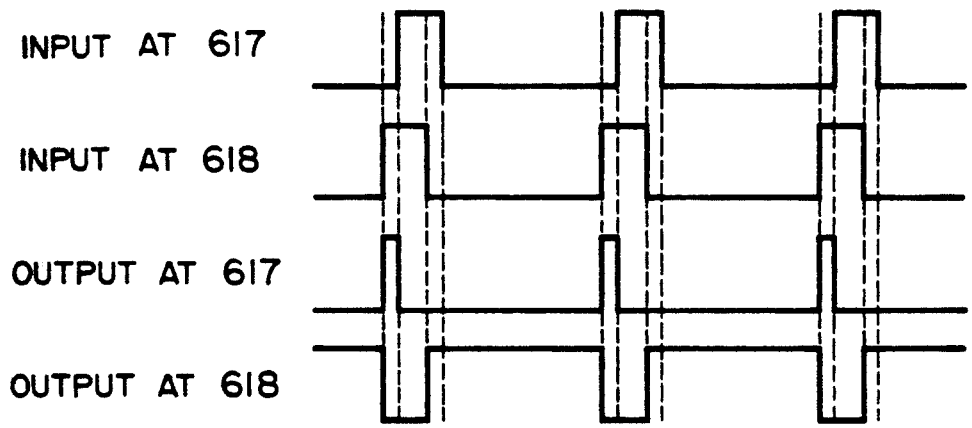

The input terminal 601 is connected with a clock signal from point $A_1$, and the input terminal 602 with a reference signal from point $A_2$. Also, an arrangement is made in such a way that when a reference signal is applied from the left side in the drawing (from 103 to 103'), the control terminal 604 is supplied with a "low" signal, and when a reference signal is applied leftward from right (from 103' to 103), supplied with a "high" signal. The variable delay circuits in FIG. 6 and FIG. 1, the latter being designated by 101, are of such type that the delay time thereof decreases with the increase in control voltage. Also, by way of explanation, the delay time du to the gate circuits 611 to 616 are expressed as $T_{11}$ to $T_{16}$ respectively, the delay time due to the fixed delay circuit as To, and the delay time due to the variable delay circuits as Tx. Assume that a reference signal is sent from left to right and the control terminal 604 is supplied with a "low" voltage signal. The outputs of the gate circuits 612 and 613 are always kept at low level, and the clock signal applied to the input terminal 601 reaches the input terminal of the gate circuit 617 through the gate circuits 611, 615 and the fixed delay circuit. In the process, the signal transmission time from the clock oscillator 104 to the gate circuit 617 in FIG. 6 is given as $\{Ta+T_{11}+T_{15}+T_0\}$. The reference signal applied to the input terminal 602, on the other hand, reaches the gate circuit 618 through the gate circuits 614, 616 and the variable delay circuits. In the process, the signal transmission time from the clock oscillator 104 to the gate circuit 618 is given as $\{T_1+T_{14}+T_{16}+Tx\}$. The circuit configured of the gate circuits 617 and 618 operates as a phase comparator circuit. Specifically, in the case where the phase of the signal applied to the gate circuit 617 is advanced of the phase of the signal applied to the gate circuit 618, the average of the output of the gate circuit 618 assumes a value proximite to a low level as shown in FIG. 7A. Upon application of this output through a buffer inverter circuit 619 to the first integration circuit, the output of the first integration circuit steadily increases until the delay time Tx of the variable delay circuits is reduced thereby to advance the phase of the signal applied to the gate circuit 618. At the same time, the output of the gate circuit 618 is applied to the second integration circuit through the gate circuits 621, 622. The output voltageof the second integration circuit steadily decreases while the delay time of the variable delay circuits in FIG. 1 increases, so that the value Ta increases thereby to delay the phase of the signal applied to the gate circuit 617. As a result, the phases of the signals applied to the gate circuits 617 and 618 approach to each other. In the case where the phase of the signal applied to the gate circuit 617 is delayed, on the other hand, the average of the output of the gate circuit 618 assumes a value near to a high level as shown in FIG. 7B. The result is a phenomenon reverse to that mentioned above, in which the phase of the signal applied to the gate circuit 618 is delayed, while that of the signal applied to the gate circuit 617 advanced. In this case, too, therefore, the phases of the signals applied to the gate circuits 617 and 618 approach to each other.

Through the processes mentioned above, the phases of the signals applied to the gate circuits 617 and 618 become substantially equal to each other under steady conditions. Thus, $$\{Ta+T_{11}+T_{15}+T_0\}=\{T_1+T_{14}+T_{16}+Tx\} \therefore Ta-T_1=(T_{14}+T_{16}+Tx)-(T_{11}+T_{15}+T_0) \quad (3)$$

Now, assume that a reference signal is sent from right to left (in the direction from 103' to 103), in FIG. 1 with the control terminal of the circuit in FIG. 6 at high level. The output of the gate circuits 611 and 614 are suppressed, and the signal applied to the input terminal 602 is transmitted to the gate circuit 617, while the signal applied to the input terminal 601 is applied to the gate circuit 618. The signal transmission time from the clock oscillator 104 to the gate circuits 617 and 618 are $\{T_2+Tbc+Tab+T_{12}+T_{15}+T_0\}$ and $\{Ta+T_{13}+T_{16}+Tx\}$ respectively. If the transmission time of the two signals fail to coincide with each other, the values Ta and Tx undergo a change through the processes mentioned above, so that these two values come to coincide with each other under steady conditions. Thus, $$\{T_2+Tbc+Tab+T_{12}+T_{15}+T_0\}=\{Ta+T_{13}+T_{16}+Tx\} \therefore Ta-(T_2+Tbc+Tab)=(T_{12}+T_{15}+T_0)-(T_{13}+T_{16}+Tx) \quad (4)$$

Unlike in the preceding case where the gate circuit 620 is suppressed with the gate circuit 621 passing the output of the gate circuit 618, the gate circuit 621 is closed with the gate circuit 620 passing the output of the gate circuit 617 in the case under consideration. As a result, although the value Ta decreases with the increase in the value Tx in the preceding case, the value Ta increases with the value Tx in the case under consideration. If the characteristic of the first integration circuit substantially coincides with that of the second integration circuit and the characteristic of the variable delay circuit in FIG. 6 is almost the same as that of the variable delay circuit 101 in FIG. 1, then the amount of change in Tx substantially coincides with that of Ta. Thus, the relationship of equation (4) holds without substantially negating the relationship of equation (3). After several processes of sending a reference signal rightward and leftward, therefore, both the equations (3) and (4) come to hold.

$$\{Ta-T_1\}+\{Ta-(T_2+Tbc+Tab)\}=(T_{14}-T_{13})+(T_{12}-T_{11}) \quad (5)$$

In view of the fact that the gate circuits 611, 612, 613 and 614 are arranged in close proximity to each other in a single integrated circuit, $T_{11}$ may be designed to be almost equal to $T_{12}$, and $T_{13}$ to $T_{14}$. Thus, the right side of the equation (5) becomes zero, and the equation below is obtained.

$$\{Ta-T_1\} \approx -\{Ta-(T_2+Tbc+Tab)\} \quad (6)$$

It is thus possible to effect control in such a way that the phase difference with a reference signal sent rightward has an absolute value equal to and opposite in sign to that of the phase difference with a reference signal transmitted leftward. The characteristics of the first and second integration circuits or those of the two variable delay circuits may not always coincide with each other, in which case it takes some time before both the equations (3) and (4) come to hold. Also, it will be seen from the operating principle of the circuit of FIG. 6 that the input terminals 601 and 602 or the high and low levels of the signal applied to the control terminal may be replaced with each other with equal effect.

Also, the variable delay circuits may be of such a type that the delay time increases with the control voltage. In the last-mentioned case, the input of the gate circuit 619 is connected with the output of the gate circuit 617, and the control inputs of the gate circuits 620 and 621 are replaced with each other.

Also, if another set of gate circuits and integration circuits is added between the first and second integration circuits and each variable delay circuit, the ripples contained in the outputs of the circuit 618 shown in FIG. 7A and the circuit 617 shown in FIG. 7B are removed for more stable operation.

In the case where a variable delay circuit of digital control type is used, on the other hand, an integration circuit of digital output type or an A/D converter is of course employed.

In the case where there is a difference of a half cycle or more of the clock signal between Ta and $\frac{1}{2}(T_1+T_2+Tab +Tbc)$ in initial condition, the matching under steady condition is effected with an integral multiple of the period of the clock signal. This poses no problem when the oscillation period of the clock oscillator 104 remains stable, but a skew occurs when the oscillation period is in fluctuation. This inconvenience may be avoided by supplying a signal of a long oscillation period from the clock oscillator 104 initially (or by dividing the frequency thereof), followed by the operation with the desired period after the steady condition is entered.

Figure 8:
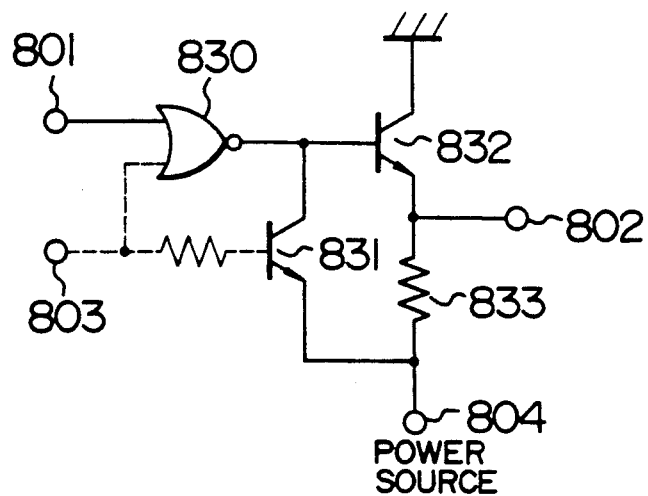

Now, an example of the drive circuits 103, 103' in FIG. 1 is shown in FIG. 8. In FIG. 8, the resistance value of a resistor 833 is matched with the characteristic impedance of a bidirectional signal line 106 in FIG. 1, and a transistor 832 is adapted to be of such a capacity as capable of driving a load having a resistance value one half that of its own. A clock signal from the clock oscillator 104 is applied to a terminal 801. In the case where a "high" signal is applied to the terminal 803 from a control signal generation circuit 105, the output of the gate circuit 830 becomes "low" while the transistor 831 begins to conduct. As a result, the transistor 832 is always cut off, so that this circuit as viewed from the output terminal 802 is equivalent to a matching terminal circuit. If "low" signal voltage is applied to the control terminal 803 from the control signal generation circuit 105, however, the transistor 831 is cut off and a signal inverted from the signal applied to the input terminal 801 is applied to the base of the transistor 832. As a result, this circuit acts as a drive circuit, that is, a reference signal source. If the circuits of FIG. 8 are used as the drive circuits 103, 103' so that a "low" voltage is applied to the control terminal 803 of one drive circuit while a "high" voltage signal is applied to the control terminal 803 of the other drive circuit, then it is possible to realize the desired functions of a drive circuit and a matching terminal circuit. In view of the voltage drop between the base and emitter of the transistor 832, by the way, the output level of the gate circuit 830 is required to be shifted from the input level of the phase difference detection circuit 102.

Figure 9:
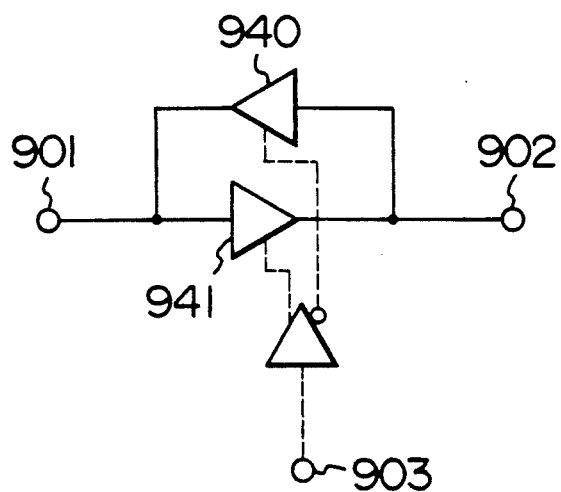

In FIG. 1, the clock oscillator 104 may be configured the same way as the clock oscillator used with conventional computer. Also, an oscillator of low frequency may be inserted independently as a control signal generator 105 or the output of the clock oscillator may alternatively be divided in frequency appropriately. If the skew of the control signal for switching the leftward and rightward transmission of a reference signal is to be ineffective, on the other hand, it is recommended that one more control signal line is formed for and the signal therethrough is used as an indication of whether the reference signal is being switched or not. If the reference signal is under switching, the integration circuits in FIG. 6 are deenergized from the integrating operation thereof (or the outputs of the gate circuits 619, 622 are rendered high in resistance if an analog integration circuit is involved). Further, the dynamic skew of the clock signal is effectively reduced by sending the clock signal differentially. This invention is also applicable to such a case. For such a purpose, a set of two bidirectional signal lines 106 are inserted, taking care that the difference in signal transmission time between the two signal lines does not exceed the signal rise or fall time. In the event that the bidirectional signal lines 106 are so long that a signal is liable to become dull midway, a relay circuit shown in FIG. 9 may be inserted. The gate circuits 940, 941 with control terminal in FIG. 9 function as a drive circuit or a matching terminal circuit like the circuits in FIG. 8. If the gate circuits 940, 941 are formed in close proximity to each other in a single integrated circuit, the characteristics thereof can be matched with each other, and therefore it is possible to cause the transmission time of a signal rightward through this circuit to coincide substantially with that leftward therethrough. The foregoing description relates to a specific circuit and component parts thereof according to a first embodiment.

Figure 10:
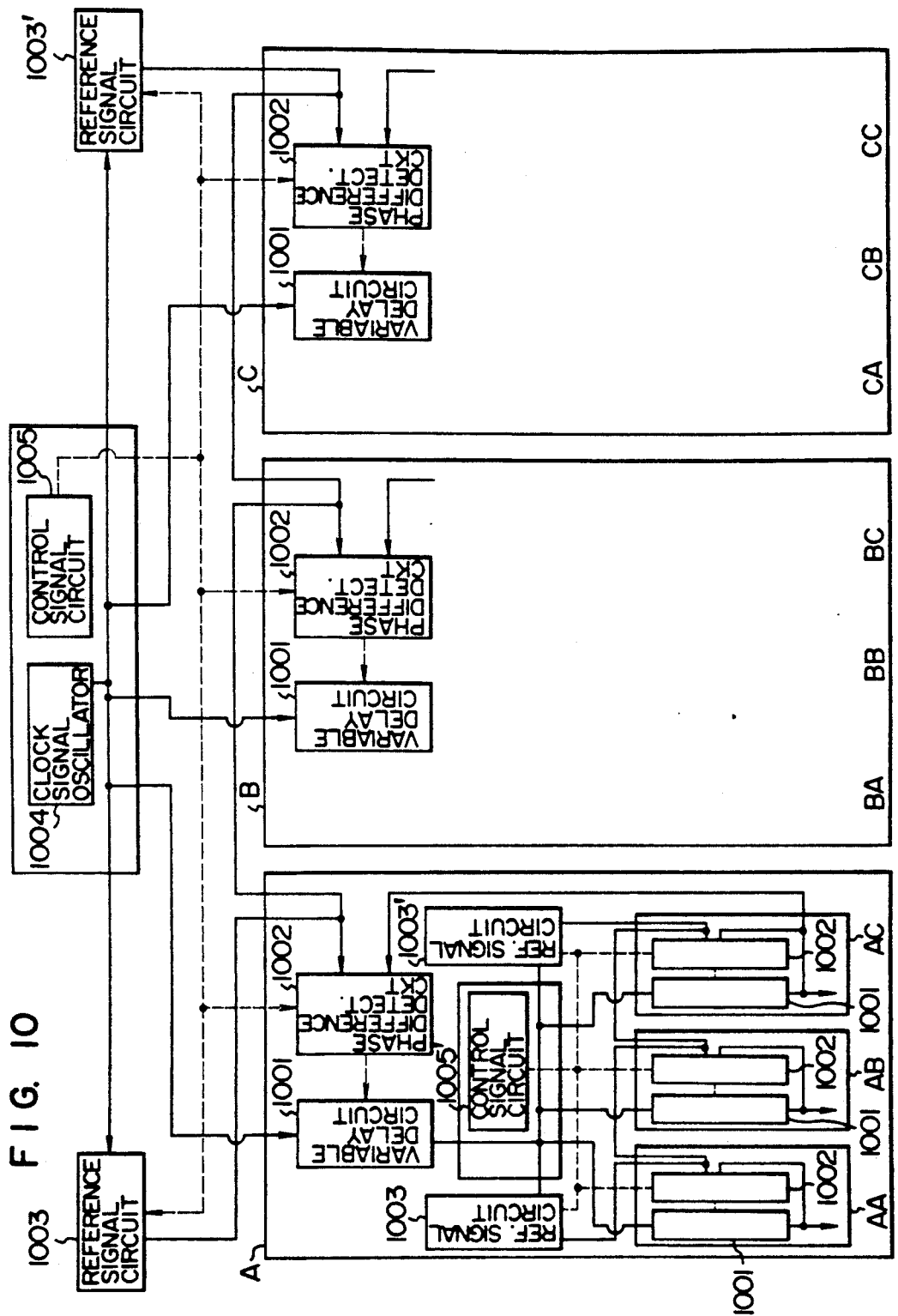
FIGS. 10 and 11 show other embodiments of the present invention respectively.

FIG. 10 shows an example in which the present embodiment is applied in two stages. In FIG. 10, a clock signal generated from a clock oscillator 1004 is distributed among the destinations A, B and C and further among the phase adjusting circuits in the destinations AA, AB, AC or BA, BB, BC or CA, CB, CC included in the former destinations. A circuit similar to the one included in the first embodiment is constructed in each of the destinations A, B and C. A phase adjusting function similar to the one included in FIG. 1 is performed in each of the destinations including the phase adjusting circuits AA, AB, AC or BA, BB, BC or CA, CB, CC. Further, phases are adjusted between the destinations A, B and C in the same manner as in FIG. 1. As a result of phase adjustment among all the phase adjusting circuits in the destinations AA to CC, it follows that the phases of clock signals in each destination are adjusted. In the process, however, it is necessary to take care that the period of the output of an external control signal source 1005 does not coincide with the period of the output of a control signal source 1005' in each of the phase adjusting circuits A, B and C. In the case where there are a great number of destinations involved, an increased number of connector junctions of the bidirectional signal lines 106 or an increased length thereof are liable to distort the signal. Application of this embodiment is effective especially in such a case. In FIG. 10, the external phase difference detection circuit 1002 is depicted outside of the phase adjusting circuit AC to facilitate viewing, and is desirably contained in the circuit AC. It is possible alternatively to expand the concept of FIG. 10 to three or more stages.

Figure 11:
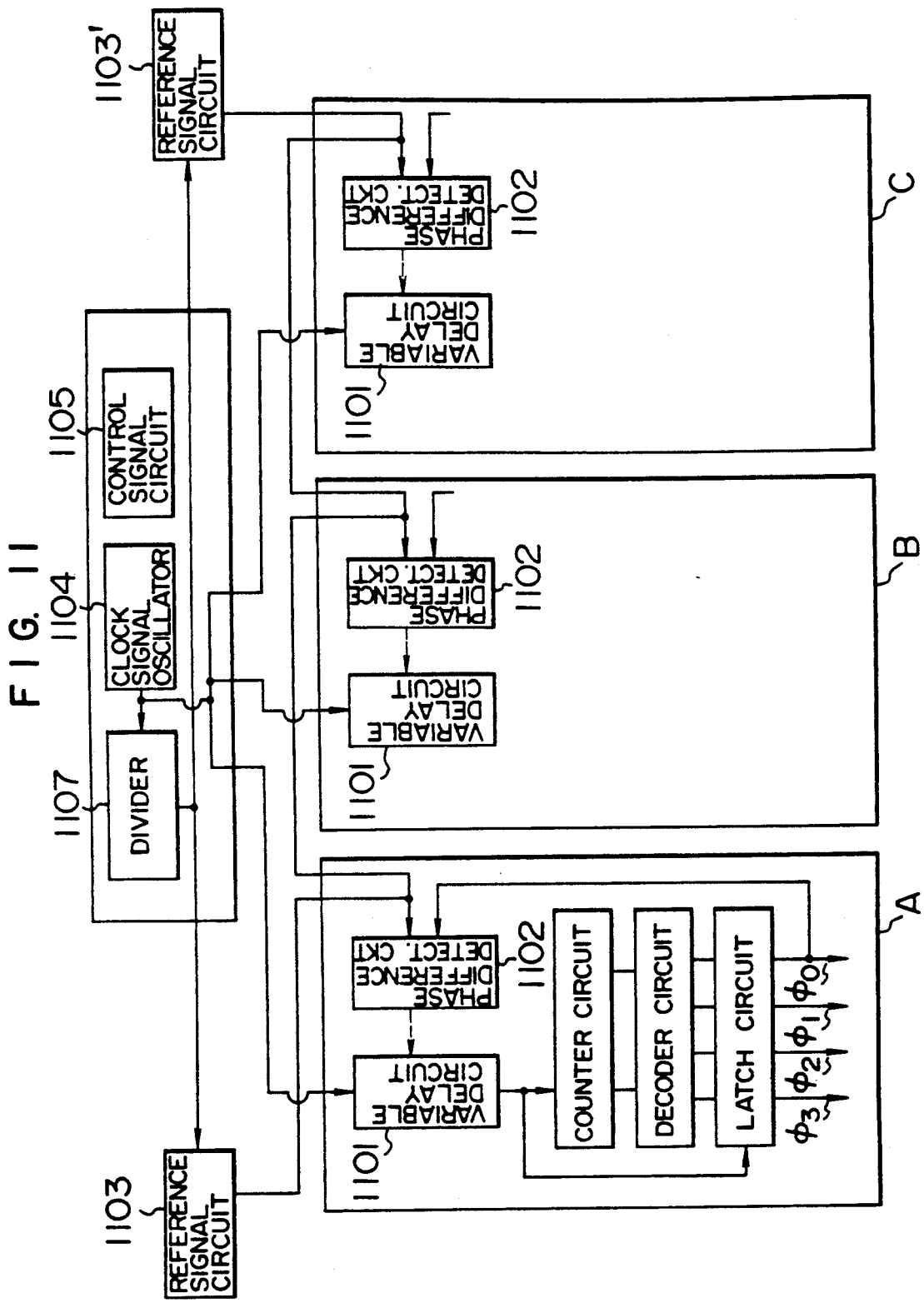

FIG. 11 shows another embodiment.

In FIG. 11 following FIG. 10, the configuration of the destinations B and C is not shown and is identical to that of the phase adjusting circuit A.

In the case of sending a plurality of clock signals of different phases, the number of points requiring phase adjustment would generally increase in proportion to the number of phases. If the configuration of FIG. 11 is used, however, the phases of a plurality of clock signals of a plurality of phases can be adjusted by a phase adjusting mechanism for only one phase. A case of sending clock signals of four phases is shown in FIG. 11. In FIG. 11, a clock oscillator 1104 is for oscillating a signal of a frequency four times higher than a clock signal intended, and the signal thus oscillated is distributed among destinations. In each of the destinations, this signal is divided in frequency by a counter circuit and after being converted into signals of four phases through a decoder, is applied to a latch circuit. The latch circuit takes up clock signals $\phi_0$ to $\phi_3$ in synchronism with the output of a variable delay circuit 1101. As a result, the phase difference between the clock signals $\phi_0$ and $\phi_1$, between $\phi_1$ and $\phi_2$, between $\phi_2$ and $\phi_3$ and between $\phi_3$ and $\phi_0$ becomes all equal to the period of an output signal of the clock oscillator 1104, so that phase adjustment for only one of the signals $\phi_0$ to $\phi_3$ completes the adjustment of all the phases involved. A reference signal used for phase adjustment is obtained by dividing the output of the clock oscillator into four frequencies by a frequency divider 1107. This is of course also the case with other numbers of phases beside four. The signal line from a control signal generator 1105 is not shown in the drawing of FIG. 11.

Now, still another embodiment of the present invention will be explained. A configuration of such an embodiment is shown in FIG. 12. In FIG. 12, numeral 1205 designates a clock oscillator, characters A, B and C destinations of the clock signals, numeral 1206 a first signal line for supplying clock signals from the clock oscillator 1205 to the phase adjusting circuit in each destination, and numeral 1203' a reference signal generation circuit for forming a reference signal used for phase adjustment, which reference signal generator is provided by a frequency divider for frequency-dividing a clock signal generated by the clock oscillator 1205 according to this embodiment. Numeral 1207 designates a second signal line for supplying a reference signal formed by the frequency divider 1203', i.e., a reference signal generation circuit, to the phase adjusting circuit included in each destination of the clock signal.

Each of the phase adjusting circuits arranged in the clock signal destinations A, B and C includes a variable delay circuit 1201 for controlling the delay time of a receiving clock signal, a waveform shaping circuit 1204 for shaping the signal through the variable delay circuit 1201 into a desired clock signal waveform, a frequency divider 1203 for dividing the resulting clock signal in frequency, and a phase comparator circuit 1202 for comparing the output phase of the frequency divider 1203 with the phase of the receiving reference signal transmitted through the second signal line 1207. The signal delay time of the variable delay circuit 1201 is adjusted so that by feeding back the result of comparison at the phase comparator circuit 1202 to the variable delay circuit 1201, the output signal of the frequency divider 1203 is in phase with the signal transmitted via the second signal line 1207.

The second signal line 1207 is wired to each destination over the same length in order to secure the same signal transmission time. By setting the phase of the clock signals supplied to the destinations to the phase of the reference signal, therefore, the phases of all the clock signals distributed among the destinations come to coincide with each other.

Now, the operation of the circuit shown in FIG. 12 will be explained. A clock signal generated in the clock oscillator 1205 is supplied to the phase adjusting circuits in the respective destinations A, B and C by the first signal line 1206. The waveform of this clock signal may be either rectangular or sinusoidal. Also, the signal transmission time to each destination over the first signal line 1206 are not necessarily accurately identical to each other. Therefore, it is possible to insert an amplifier at a given position along the signal line 1206 or a waveguide may be used or the clock signal may be converted into an optical signal to permit transmission of a signal of short period.

The second signal line 1207 is for transmitting the output of the clock oscillator 1205 frequency-divided by the frequency-divider 1203' making up a reference signal generator, which signal is used as a reference for phase adjustment at each destination. The period of the signal passing through the second signal line 1207, therefore, is longer than that of the signal passing through the first signal line 1206 and is less liable to cause the attenuation of the signal amplitude or the like. It is, however, necessary to secure the same length of all the signal transmission time from the frequency divider 1203' to the phase comparator circuit 1202 in the phase adjusting circuit at each destination.

The clock signal that has arrived at each of the phase adjusting circuits in the destinations A, B and C through the first signal line 1206 is applied to the variable delay circuit 1201 and the phase thereof adjusted by a predetermined amount described later. The output of the variable delay circuit 1201 is applied to the waveform shaping circuit 1204 for shaping the same into a desired clock signal waveform and producing a shaped signal as an output. A part of this output signal is applied to the frequency divider 1203, and the signal thus frequency-divided is applied to the phase comparator circuit 1202 for comparison with the phase of a received reference signal, supplied to each of the destinations A, B and C through the second signal line 1207. The phase comparator circuit 1202 compares this clock signal with the phase of the received reference signal, and applies to the variable delay circuit 1201 a signal for delaying the phase of the received clock signal by an amount required for coincidence between the phases of the two signals. The signal transmission time over the second signal line 1207 for all the destinations are adjusted to coincide with each other, and therefore all the clock signals produced from the phase adjusting circuits in the respective destinations coincide with each other.

Now, each component element of the phase adjusting circuits shown in FIG. 12 will be explained.

In FIG. 12, the variable delay circuit 1201, which is realizable by the configuration of FIG. 2, FIG. 3, FIG. 4 or FIG. 5 explained above with reference to the first embodiment, will not be explained any more.

Figure 13:
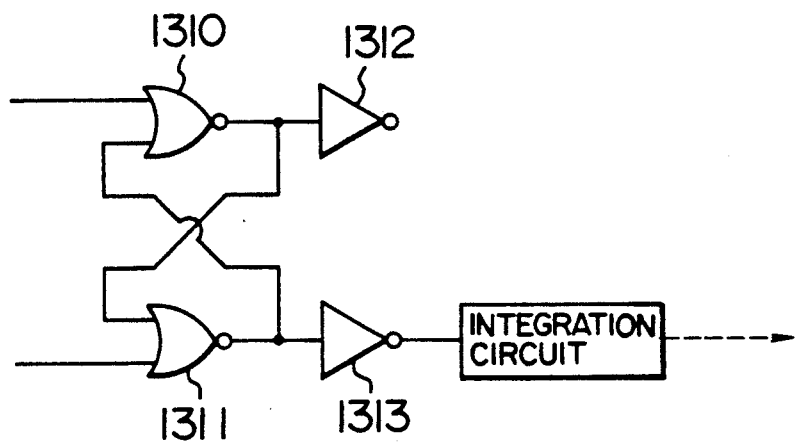
FIGS. 13 and 15 to 18 are diagrams showing component elements of the embodiment of FIG. 12 in detail.
Figure 14A:
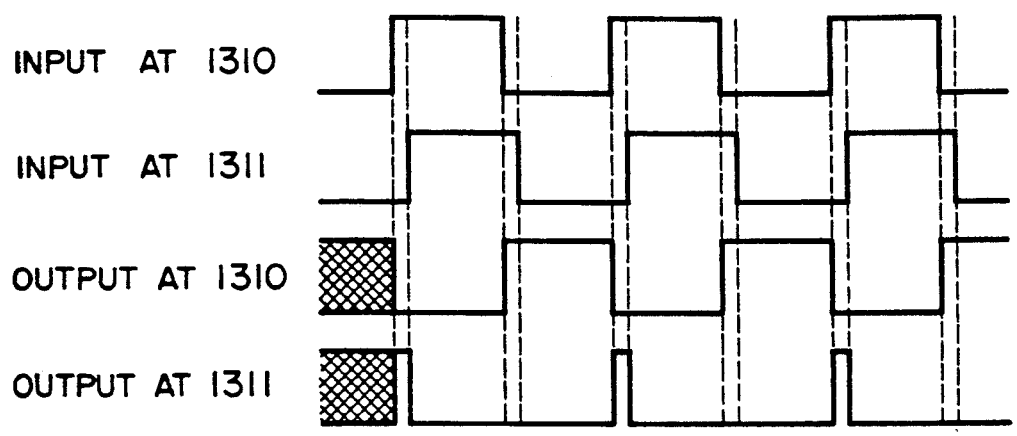
FIGS. 14A and 14B show waveforms for explaining the operation of the circuit of FIG. 13.
Figure 14B:
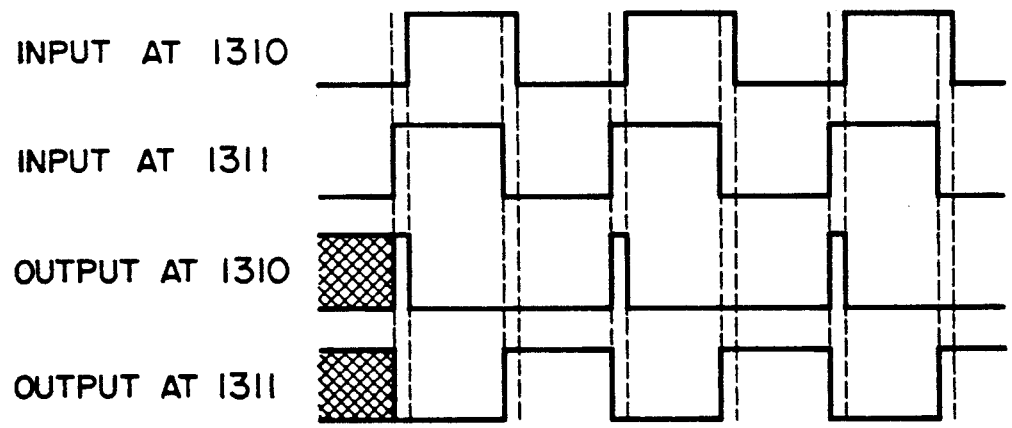

FIG. 13 is a diagram showing an example of a phase comparator circuit. If a circuit of such a type that the delay time thereof decreases with the increase in control voltage is used as the variable delay circuit 1201 in FIG. 12, for instance, the received reference signal transmitted via the second signal line 1207 in FIG. 12 is applied to the gate circuit 1310 of FIG. 13 and the output of the frequency divider 1203 to the gate circuit 1311. Also, the time constant of the integration circuit is set sufficient by long as compared with the period of the signal applied to the gate circuit 1310 or 1311. The relationship between the input and output of the gate circuits 1310 and 1311 is shown in FIGS. 14A and 14B. The output waveforms in FIGS. 14A and 14B ignore the delay time in the gate circuits 1310 and 1311. In the case where the phase of the signal applied to the gate circuit 1311 is retarded from that of the signal applied to the gate circuit 1310, the average output of the gate circuit 1311 assumes a value near to the low level as shown in FIG. 14A. This output is applied through a buffer inverter circuit 1313 to an integration circuit, so that the average output of the inverter circuit 1313 takes a value proximate to the high level, with the result that the output voltage of the integration circuit steadily increases thereby shortening the delay time of the variable delay circuit 1201. The phase of the signal applied to the gate circuit 1311 is thus advanced.

In the case where the phase of the signal applied to the gate circuit 1311 is advanced of that of the signal applied to the gate circuit 1310, by contrast, the average output of the gate circuit 1311 assumes a value near to the average of the low and high levels as shown in FIG. 14B, and the output voltage of the integration circuit steadily decreases, thereby retarding the phase of the signal applied to the gate circuit 1311. As a result, the signals applied to the gate circuit 1310 and the gate circuit 1311 are almost in phase with each other under steady condition. Incidentally, the gate circuit 1312 is a dummy gate circuit for matching the load conditions of the gate circuits 1310 and 1311. Also, if the gate circuits 1310 to 1313 are arranged in close proximity to each other within a single integrated circuit, the delay time difference between the gate circuits 1310 and 1311 is reduced, thereby improving the accuracy of phase adjustment. In place of the circuit of FIG. 13, the part 710 of the circuit shown in FIG. 37 or the circuit of FIG. 40 may be used as a phase comparator circuit, the operation of which will be explained later.

The clock oscillator 1205 in FIG. 12 may be configured the same way as the conventional clock oscillator used with the computers.

A method of configuring the frequency divider, which is described in various forms of circuits in catalogs dealing with a small scale integrated circuit, will not be described herein. Also, the waveform shaping circuit 1204, if used only for the purpose of transforming into a rectangular wave, may include only an amplifier and a clamp circuit or the like. But, if an accurate shaping of a pulse duration is also desired, a one-half frequency divider will be capable of producing a waveform having a duty cycle of almost 50%. The use of a counter circuit, on the other hand, would make possible setting to other duty cycles. The foregoing is a description of an example of a specific circuit according to the embodiment of FIG. 12.

Figure 15:
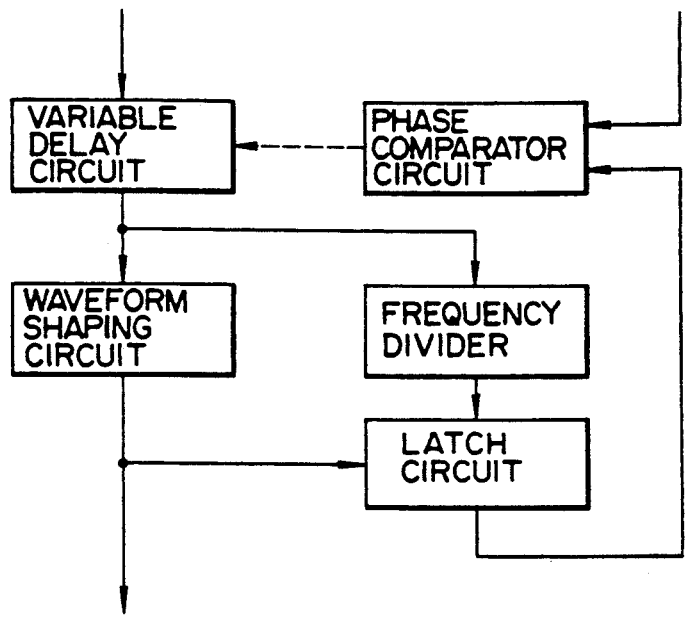
Figure 16:
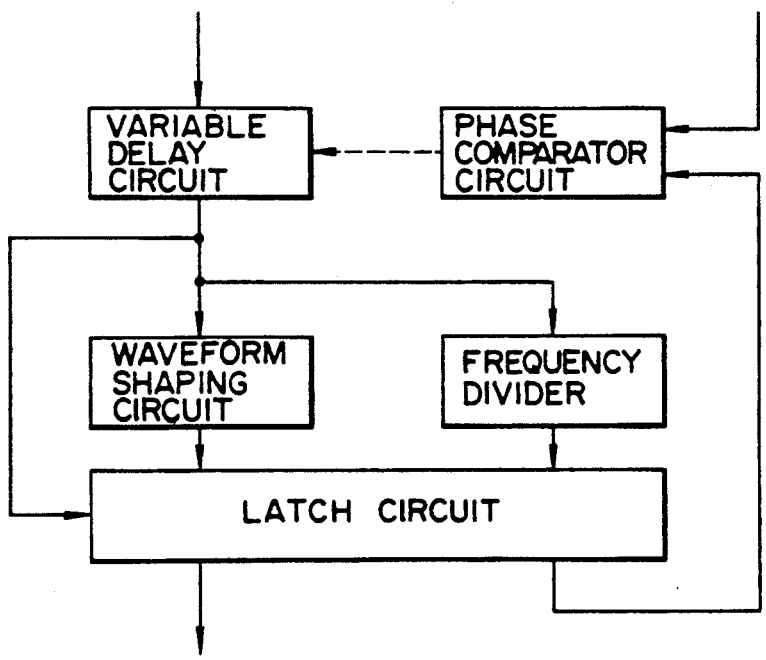
Figure 17:
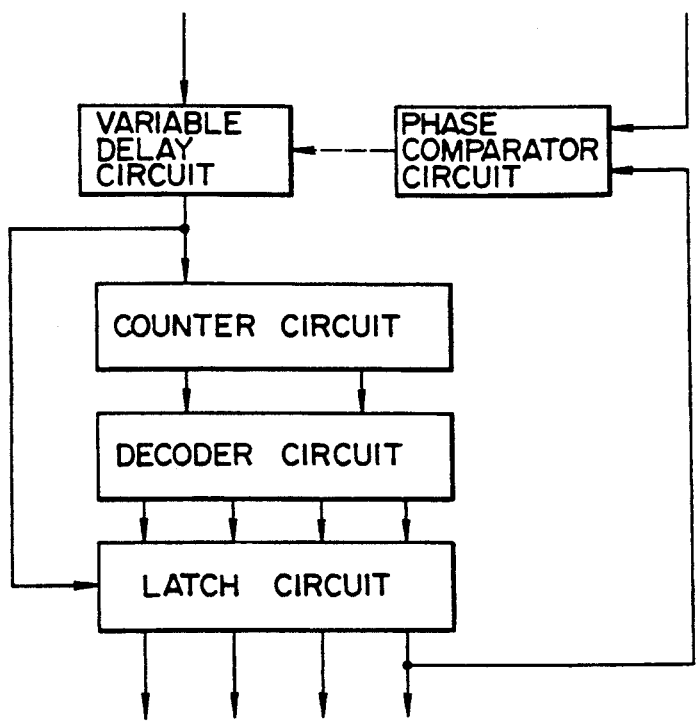
Figure 18:
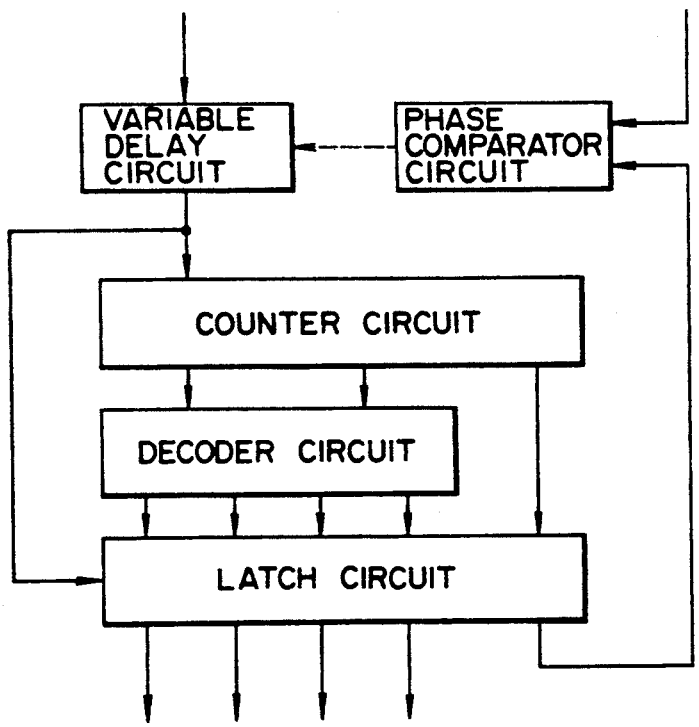
Figure 19:
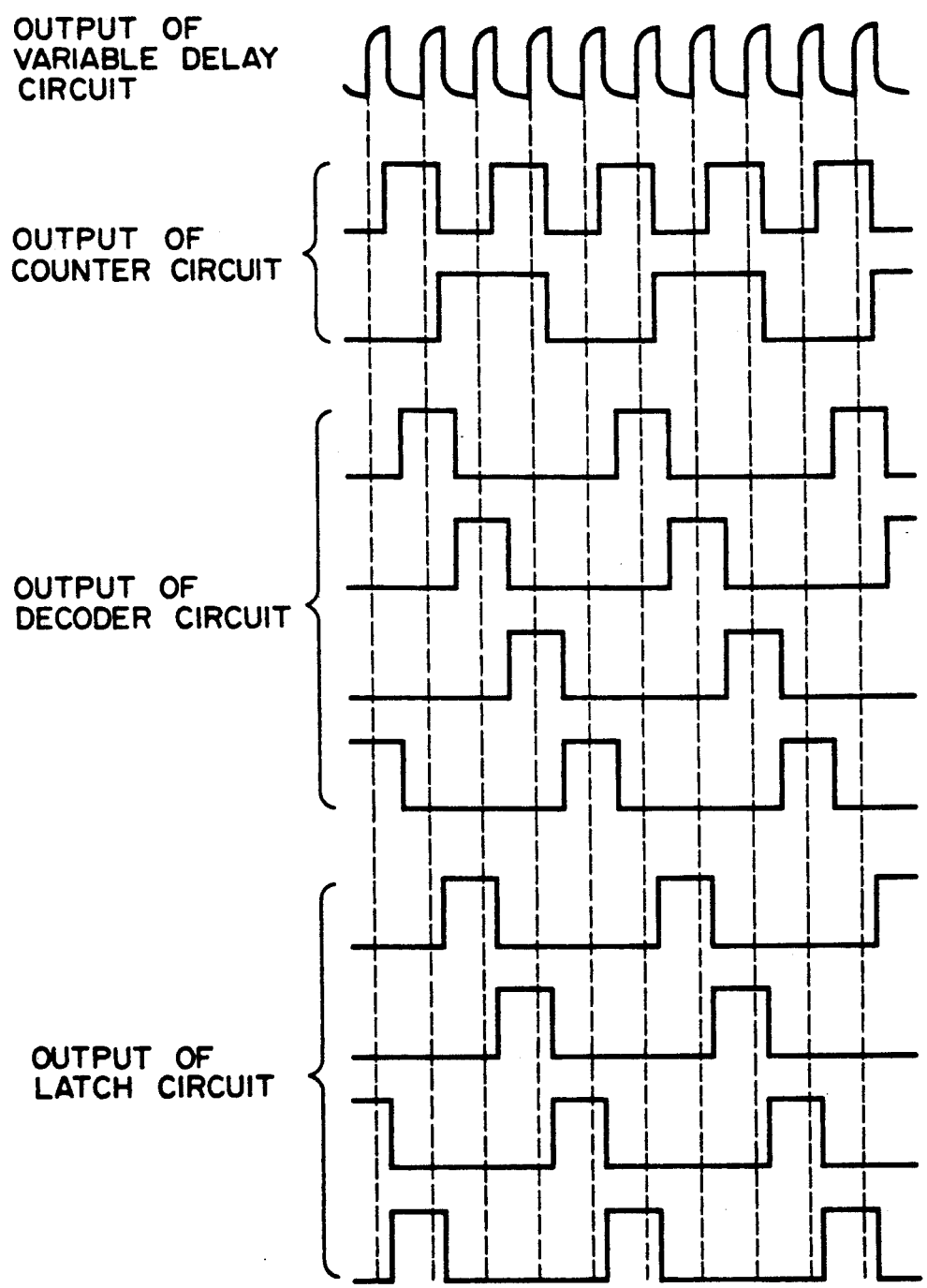
FIG. 19 is a diagram showing waveforms for explaining the operation of the circuit shown in FIG. 17.

FIGS. 15 to 18 show a further embodiment of the phase adjusting circuits. The phase adjusting circuits arranged in the destinations A, B and C in FIG. 12 may be replaced by any of those shown in FIGS. 15 to 18 to embody the invention with equal effect. If a latch circuit as shown in FIG. 15 or 16 is inserted, on the other hand, the variations in delay time of the frequency dividers of the phase adjusting circuits are absorbed, and therefore the accuracy of phase adjustment of clock signals is improved. Also, in the case where transmission of multi-phase clock signals or a clock signal of a duty cycle other than 50% is desired, a counter circuit like the one shown in FIG. 17 or FIG. 18 is recommended. FIG. 17 and FIG. 18 show an embodiment in which clock signals of four phases with a duty cycle of 25% are transmitted. FIG. 19 shows an example of output waveforms produced from the variable delay circuit, the counter circuit, the decoder and the latch circuit. There are a number of gates between the output of the variable delay circuit and that of the decoder circuit, and therefore the number of gates is not always the same for all the routes therebetween. The phase difference between the output signals of the decoder circuit is therefore not always fixed. By providing a latch circuit, however, all the phase differences and pulse durations for all phases can be set to the period of the output of the variable delay circuit or an integral multiple thereof. As a result, if only one of the phases is adjusted as shown in FIG. 17, the other phases are adjusted automatically. When it is desired to lengthen the period of a reference signal more than that of the clock signal, on the other hand, a solution is to separate a reference signal from the clock signals. Generally, signal wiring on the exterior of an integrated circuit is longer than that on the interior thereof, and is harder to transmit a high-speed pulse. Therefore, even though it is possible to use a clock signal of a short period within an integrated circuit, it may be impossible to transmit a reference signal of the same period with high accuracy. In such a case, a configuration as shown in FIG. 18 provides an effective application.

Figure 20:
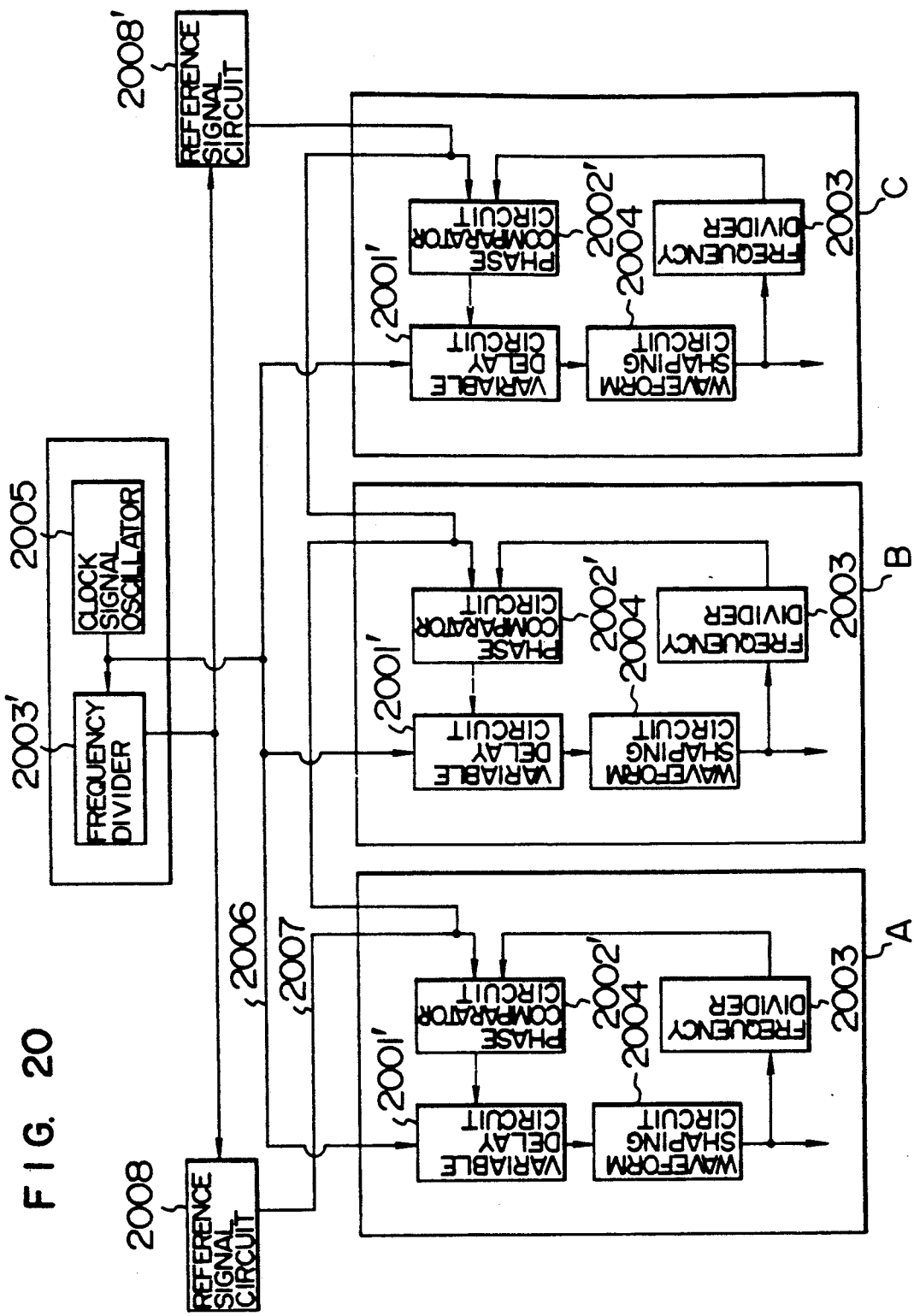
FIG. 20 is a diagram showing a configuration of the embodiments of FIGS. 1 and 12 combined with each other according to the present invention.

FIG. 20 shows an embodiment as a combination of the embodiment of FIG. 1 and the circuit of FIG. 12. In this configuration, clock signals are transmitted through a first signal line 2006, while reference signals are transmitted from two directions by a bi-directional second signal line 2007 with the signal transmission time to each destination automatically adjusted.

Any of the configurations shown in FIGS. 15 to 18 may be combined with the first embodiment. In such a case, the phase comparator circuit in any of FIGS. 15 to 18 is replaced by a phase difference detection circuit, and is used as each of the phase adjusting circuits in FIG. 20.

Figure 27A:
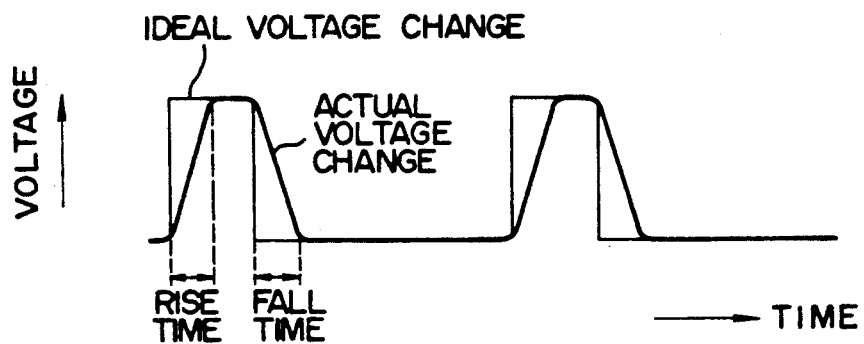
FIGS. 27A, B are diagrams for explaining a supplemental effect of the embodiment shown in FIG. 12.
Figure 27B:
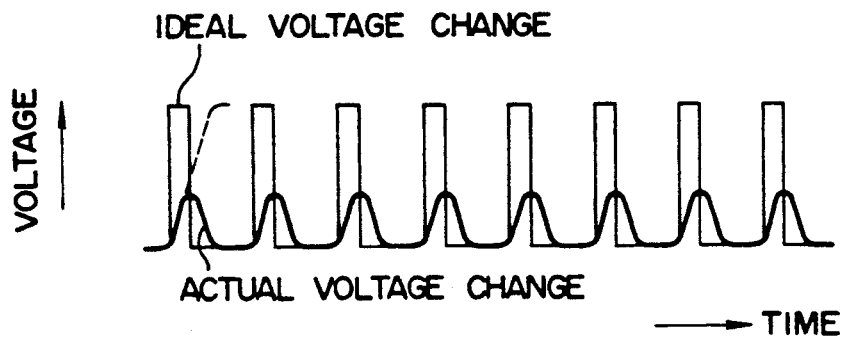

When a pulse signal passes through a signal line, it is not true that the voltage changes instantaneously from low to high level (or the other way), but as shown in FIG. 27A, the change is a gradual process requiring a certain rise (or fall) time. This rise or fall time, if shorter than the pulse duration of the clock signal, poses no serious problem. When the pulse duration of the clock pulse is shortened to increase the speed thereof, however, a fall begins before full rise of the voltage as shown in FIG. 27B, resulting in a smaller signal amplitude. The noise margin is thus reduced, thereby changing or sometimes even extinguishing the pulse itself. Especially in the case where the signal line is long, such a phenomenon is liable to occur due to an increased load or a conspicuous skin effect. A method to prevent this phenomenon is either by increasing the number of stages of buffer circuits arranged midway of the signal line for more frequent pulse shapings or by preventing the rise or fall time from lengthening. Once such a preventive action is taken, however, variations of the signal delay time of the buffer circuit would be so accumulated as to aggravate the change in pulse duration or phase variations.

Since there is no need of taking into consideration the phase change over a signal line where high frequency signal passes, the embodiment shown in FIG. 12 described above permits pulses to be shaped by a buffer circuit added at a given position. Further, if a sinusoidal wave is formed midway of a signal line, on the other hand, it is possible to reduce the chance of signal attenuation by use of an analog amplifier or the like. In the event that only the period of the clock signal is transmitted, therefore, it is possible to transmit a much shorter period than when the phase and pulse duration are transmitted at the same time. Even a signal line that is incapable of transmitting a signal of short pulse duration due to amplitude attenuation can transmit a signal of long pulse duration with a considerably stable phase.

As a consequence, if a high-frequency signal transmitted through the first signal line is shaped into a form usable as a clock signal and the transmission time of the first signal line is adjusted in such a manner that the clock signal is in phase with the signal of a reference signal high in phase accuracy transmitted through the second signal line, then a high speed clock signal is capable of being supplied with high phase accuracy.

The present invention, embodiments of which have been explained above, displays the effect thereof also when used in a plurality of stages with the circuit described below.

Figure 21:
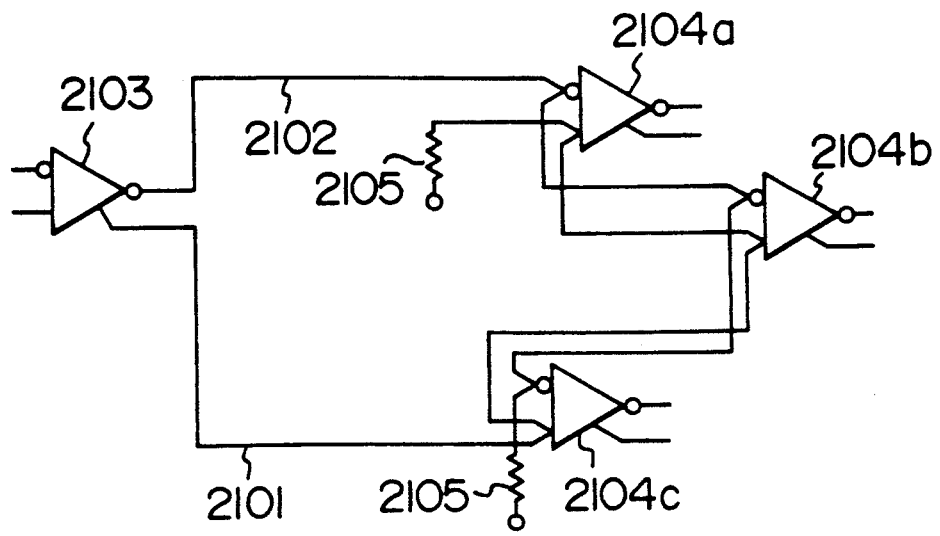
FIGS. 21 to 26 are diagrams for explaining a differential circuit usable in combination with the present invention.

FIG. 21 is a diagram showing a configuration of such a circuit. In FIG. 21, numeral 2103 designates a source circuit providing a transmitting end of a clock signal, which is transmitted through a first signal line 2101 and supplied to sink circuits 2104c, 2104b and 2104a in that order at the receiving end. A reference signal complementary with the clock signal transmitted through the signal line 2101 is also transmitted from the source circuit 2103 through the second signal line 2102 to sink circuits 2104a, 2104b and 2104c in that order. The first and second signal lines 2101 and 2102 have substantially the same length between the sink circuits 2104a and 2104b as well as between the sink circuits 2104b and 2104c. The first signal line 2101 and the second signal line 2102 are connected to a terminal resistor 2105 after being connected with the last sink circuits thereof respectively.

Figure 22:
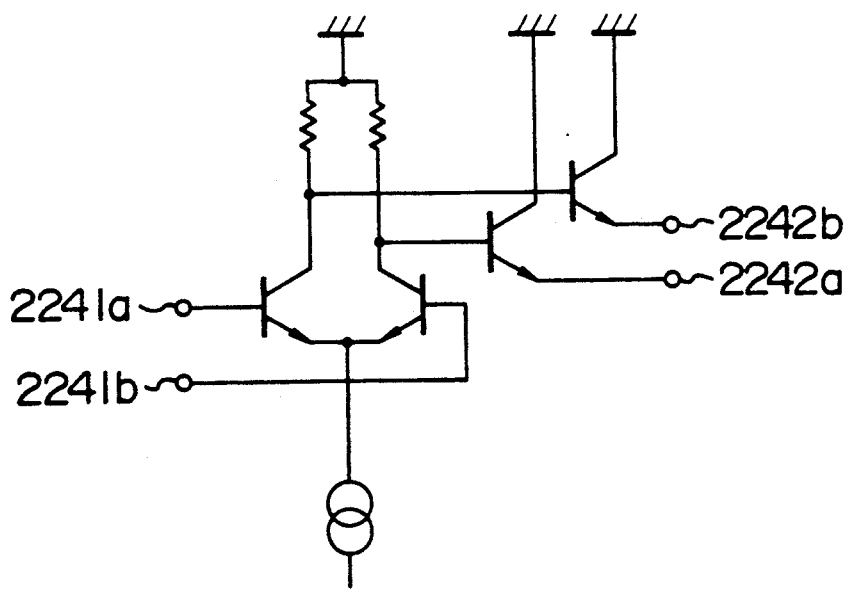

The sink circuits 2104a, 2104b and 2104c are differential circuits such as shown in FIG. 22. If the potential of an input point 2241a is higher than that of an input point 2241b, a "high" signal is produced at an output point 2242a and a "low" signal at an output point 2242b. If the potential of an input point 2241a is lower than that of the input point 2241b, on the other hand, a "low" signal is produced at the output point 2242a, and a "high" signal at the output point 2242b. In FIG. 21, the signal line 2101 is connected to the input point 2241a of this differential circuit, and the signal line 2102 to the input point 2241b thereof.

Figure 23A:
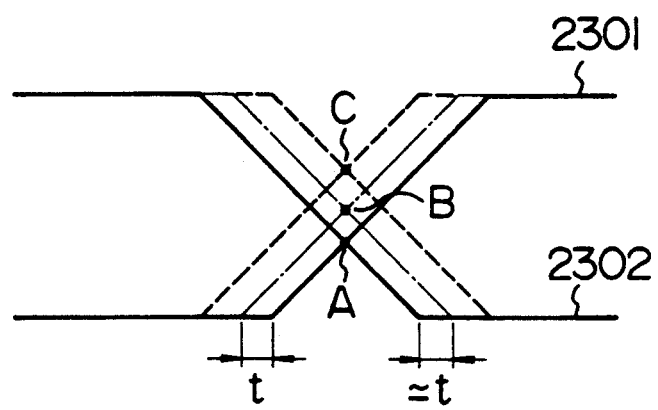
Figure 23B:
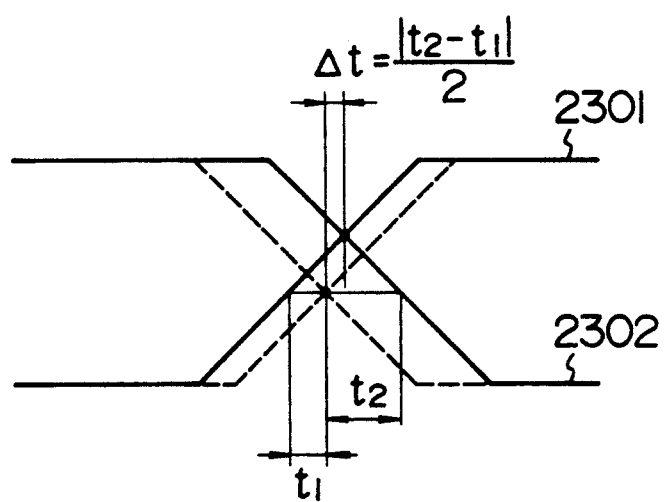

The operation of the circuit shown in FIG. 21 will be now explained with reference to FIGS. 23A and 23B. In FIG. 23A, the solid line represents a waveform produced by the sink circuit 2104a, the one-dot chain a waveform in the sink circuit 2104b, and the dashed line a waveform in the sink circuit 2104c. Assume that the time of arrival of the clock signal at the sink circuit 2104a is t behind the time of arrival of the clock signal at the sink circuit 2104b. In view of the fact that the wiring length of the signal line for the sink circuits 2104a and 2104b are substantially equal to each other, the time of arrival of a complementary signal at the sink circuit 2104a is about t advanced from that of arrival thereof at the sink circuit 2104b. As a result, to the extent that the rise time of the clock signal is equal to the fall time of the complementary signal, the clock signal reaches the same level as the complementary signal at the input point of the sink circuit 2104a at a time point (A of FIG. 23A) which is substantially the same time point (B of FIG. 23A) where the clock signal reaches the same level as the complementary signal at the input point of the sink circuit 2104b. In similar fashion, the time point (C of FIG. 23A) when the clock signal reaches the same level as the complementary signal at the input point of the sink circuit 2104c is substantially the same as the time points A and B. Thus as far as the transition period of the clock signal occurs at the same time as the transition of the complementary signal for all the sink circuits, all the sink circuits are switched substantially at the same time. FIG. 23B shows waveforms of given two sink circuits at two different input points thereof in solid and dashed lines respectively. The value allowed as a difference between the delay time $t_1$ of the clock signal and the delay time $t_2$ of the complementary signal between these two points $|t_1 - t_2|$ is required to be double or less the value allowed as a time difference $\Delta t$ of switching of the two sink circuits, and the difference in wiring length for the clock and complementary signals between the sink circuits is required to take a value meeting this range. As will be understood from the foregoing description, it is possible to switch the sink circuits almost simultaneously without any wirings of equal length between the source circuit and each sink circuit or without any plurality of source circuits by supplying a clock signal to the sink circuits 2104a, 2104b and 2104c in that order and a complementary signal to the sink circuits 2104c, 2104b and 2104a in that order. In particular, it is not necessary that the wiring length for the clock signal from the source circuit 2103 to the sink circuit 2104c is equal to that for the reference signal from the source circuit 2103 to the clock circuit 2104a. As a result, the use of this circuit configuration reduces the number of source circuits, which in turn reduces the space occupied by the system, power consumption, package area with fewer wirings, and crosstalks. Further, there are less wirings and shorter wiring length needed for the same delay time, so that even with some variations in delay per unit wiring length, variation in switching time of the sink circuits is reduced. At the same time, the layout design of the clock signal wirings is facilitated.

Figure 24:
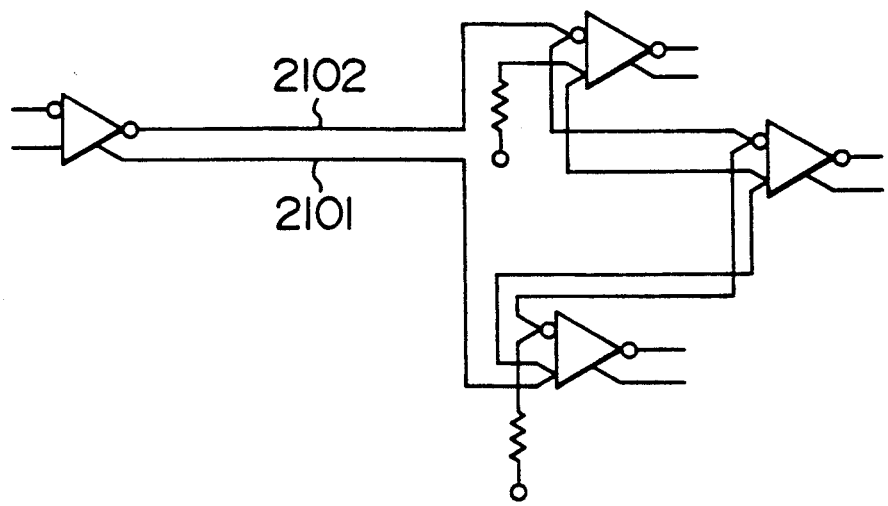

In the lines 2101, 2102 for the signal complementary with the clock signal are partially arranged in close proximity to each other as shown in FIG. 24, on the other hand, a noise induced in an external clock signal will induce a noise of substantially the same waveform in the complementary signal and is thus cancelled.

Figure 25:
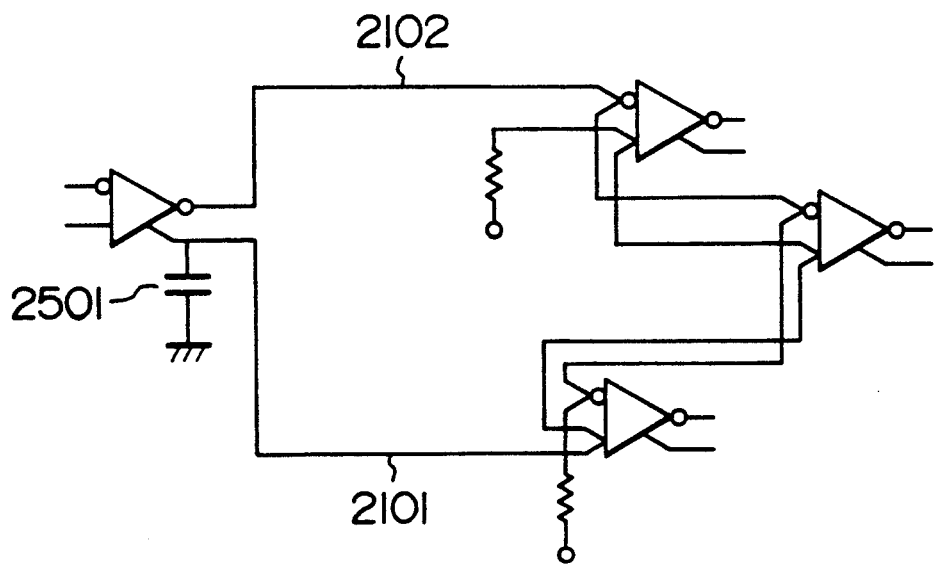

In the case where the rise time of the clock signal is different from the fall time of a complementary signal such as where the fall time of the clock signal is shorter than the fall time of the complementary signal, for instance, a capacitor 2501 may be added to the clock signal as shown in FIG. 25 to dampen the rise thereof. In such a case, the simultaneous switching of the sink circuits 2104a, 2104b, 2104c may not be assured in switching the polarity, that is, in switching the clock signal from "high" to "low" or the complementary signal from "low" to "high". Nevertheless, this does not pose any problem since a clock signal requires that only the leading or trailing edge of the pulse thereof be switched simultaneously.

Figure 26:
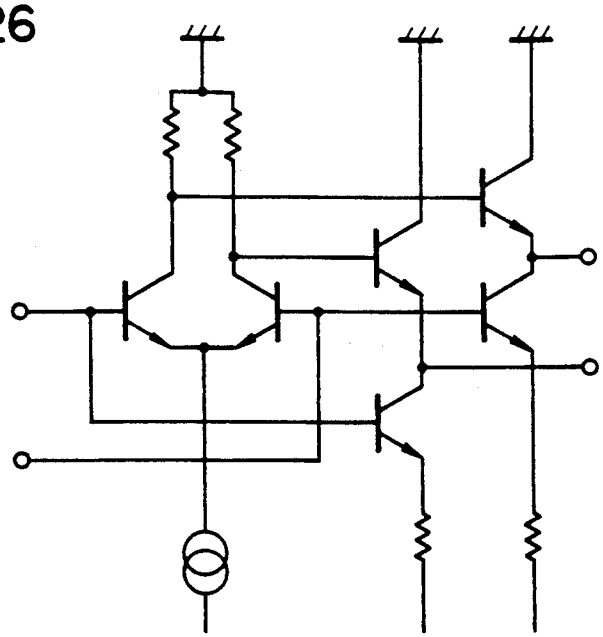

Also, if a push-pull circuit as shown in FIG. 26 is used as a source circuit, on the other hand, the rise time is rendered equal to the fall time.

In the case where the circuit described above is combined with the present invention in a plurality of stages, the amount of wiring is reduced, thereby realizing a clock signal supply system which makes it possible to supply clock signals accurately with a smaller occupied area. These circuits may be used anywhere in a system for distributing clock signals. Specifically, it may be applied to any of the cases where a clock is distributed from a clock oscillator among a plurality of modules, where a clock signal is distributed among IC chips formed on modules, or where a clock signal is distributed among a plurality of circuits formed on IC chips.

Figure 28:
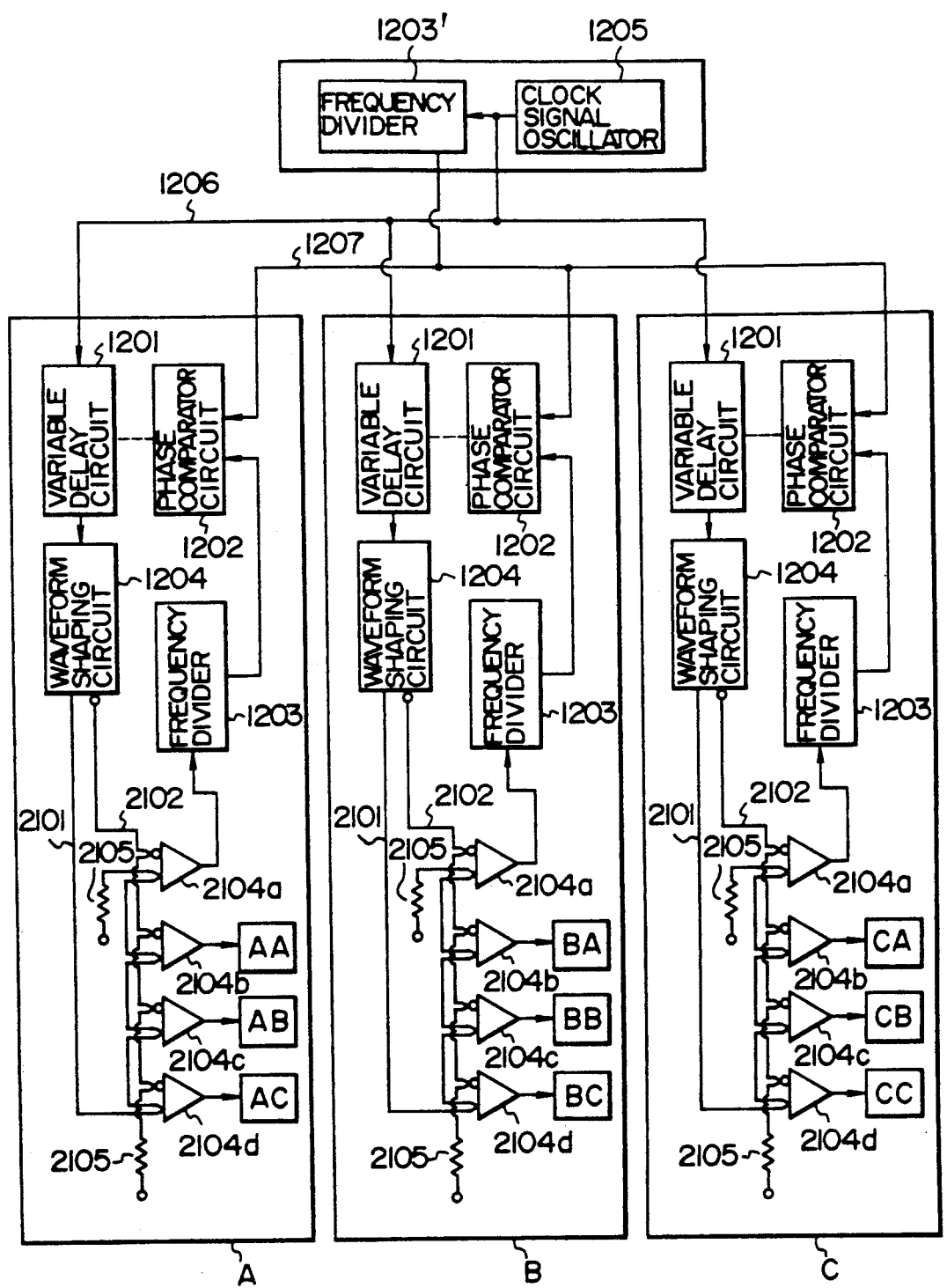
FIG. 28 is a circuit diagram showing a further embodiment of the present invention.

FIG. 28 shows an example in which the system according to the present invention (the circuit of FIG. 12) is combined with the aforementioned circuit in double stages. A clock signal is distributed among destinations A, B and C from the circuit of FIG. 12, and the clock signal is further distributed from the above-mentioned circuit among a plurality of destinations AA, AB and AC in each of the destinations A, B and C. The use of a configuration shown in FIG. 28 makes it possible to supply a clock signal among a great number of destinations with a comparatively small number of wirings.

Now, explanation will be made of an example of a clock signal supply system which is a modification of the embodiment shown in FIG. 12 according to the present invention with reference to FIG. 29. This system is intended to achieve the second and third objects of the invention. In this system, a signal line accurately phase-adjusted is shared by a plurality of clock signal systems, where the number of points requiring accurate phase adjustment is reduced. Also, by multiplying the frequency at each destination, the frequency of a signal transmitted from a clock source to each destination can be set to a level lower than the frequency of the clock signal required at each destination.

Figure 29:
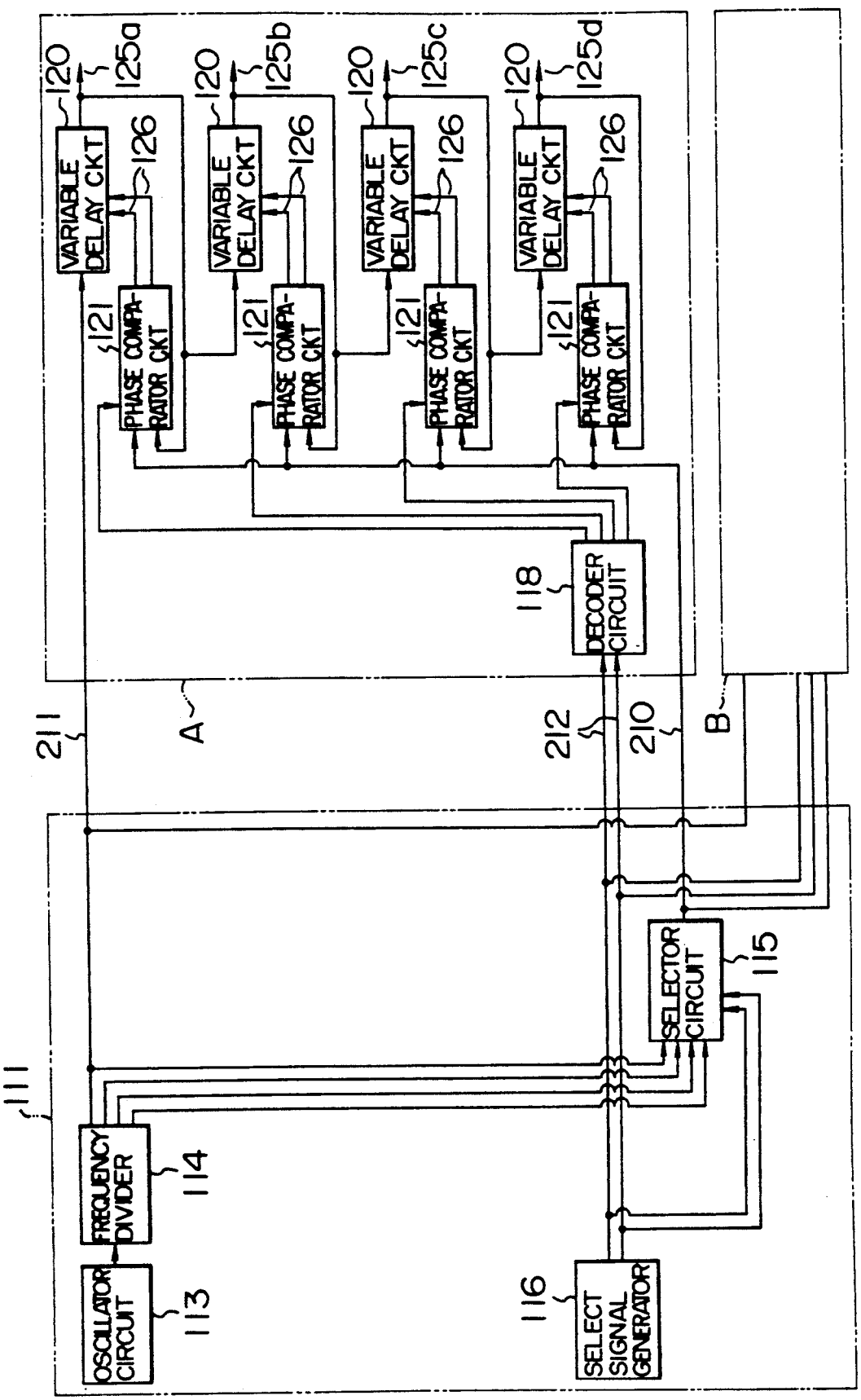

In FIG. 29, numeral 111 designates a clock source, and characters A, B destinations. Numeral 210 designates a line for passing a reference signal accurately phase adjusted, numeral 211 a line for passing a clock signal rough in phase accuracy, and numeral 212 a line for passing a select signal. At each destination, numeral 120 designates a variable delay circuit, and numeral 121 a phase comparator circuit. Numerals 125a to 125d designate clock signals automatically phase-adjusted according to the present invention, and numeral 126 a control signal for controlling the variable delay circuit. Also, an oscillator circuit 113 in the clock source 111 is for generating an original clock signal high in frequency providing a base of clock signals of various phases. A frequency divider circuit 114 is for producing clock signals of various phases by frequency dividing the original clock signal and corresponds to the circuit 1203' in FIG. 12. A select circuit 115 is for selecting one of the clock signals of various phases generated in the frequency divider circuit 114 and supplying it as a reference signal 210. A select signal generation circuit 116 is for generating a select signal 212 of a period sufficiently long as compared with the clock signal of various phases, which signal 212 is used to determine a clock signal of a given phase to be selected by the selector circuit 115.

Now, the operation of the circuit shown in FIG. 29 will be explained. In each of the destinations A and B, phases are adjusted by passing a clock signal rough in phase accuracy through the variable delay circuit 120. An output of the variable delay circuit 120 is compared with a receiving reference signal 210 supplied in the desired phase, and the result of comparison is fed back to the variable delay circuit 120 for accurate phase adjustment. While another phase of clock signal is being sent as a reference signal 210, on the other hand, the control signal from the phase comparator circuit 121 is blocked in response to a signal from a decoder circuit 118 thereby to prevent the delay time of the variable delay circuit 120 from undergoing a change. In this embodiment configured as explained above, phase adjustment is required only for the reference signal 210 and the adjustment of each phase of clock signals which has been required in the prior art is eliminated. Incidentally, a specific configuration of the variable delay circuit 120 and the phase comparator circuit 121 shown in FIG. 29 is already disclosed in FIGS. 2 to 5, and 13 and the explanation thereof. Also, if the effect of a dynamic skew caused by a power noise or the like is to be avoided, it is desirable that the non-adjusted clock signal 211 and the reference signal 210 be sent in the form of a differential signal. Further, once phase adjustment is complete, the control process should be suspended to prevent the delay time of the variable delay circuit 120 from switching to avoid the effect of a hazard. A specific configuration of the selector 115 and the decoder circuit 118 is well known.

Figure 30:
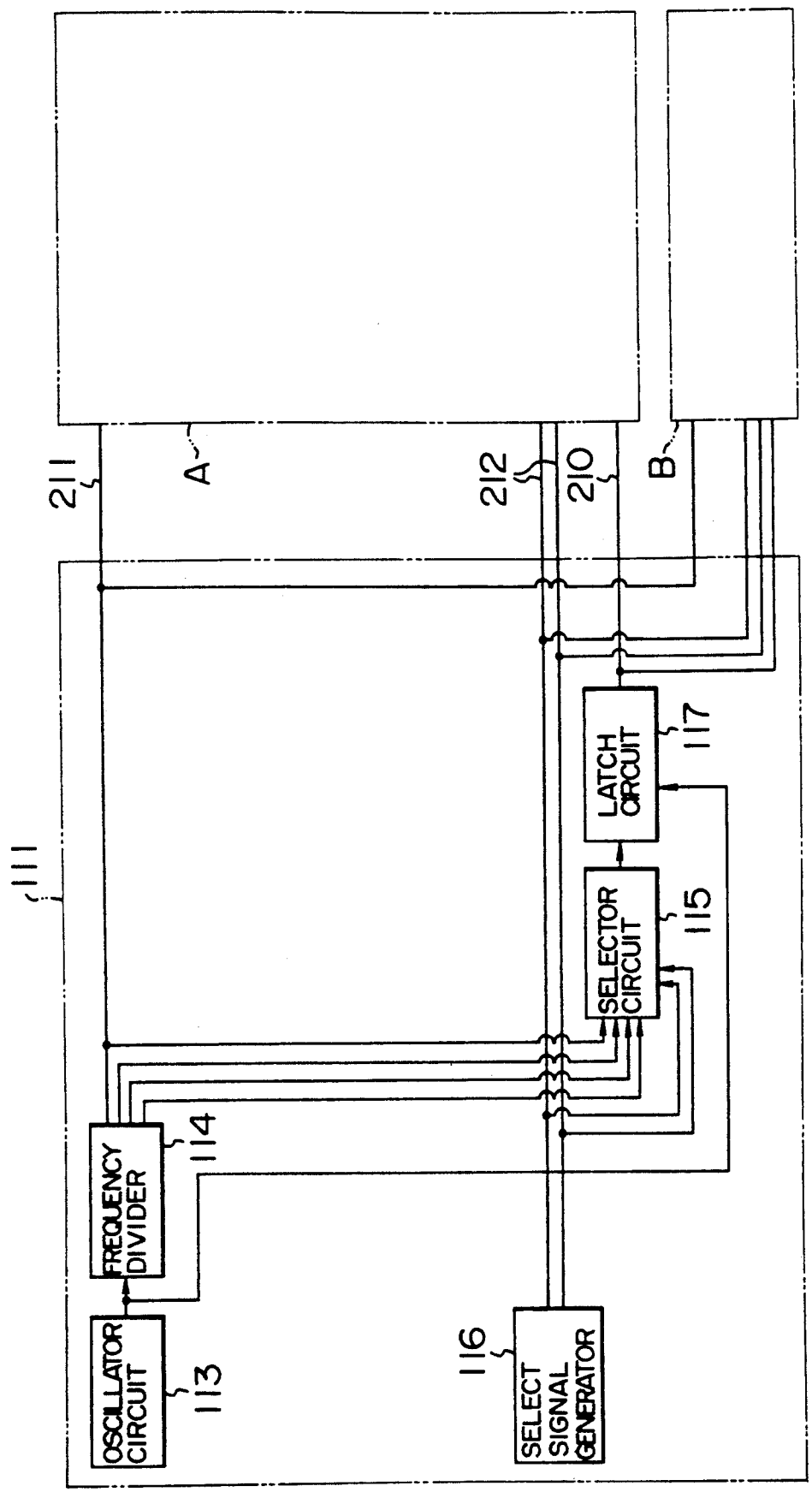

FIG. 30 shows a modification of the embodiment shown in FIG. 29. In this modification, a latch circuit 117 is inserted in the part for sending out the reference signal 210 in the clock source 111 so as to send the reference signal 210 in synchronism with the original clock. This arrangement assures equal intervals of differences of the phases sent out as a reference signal even if the load of the frequency divider circuit 114 is not uniform for each phase of the clock signals.

Figure 31:
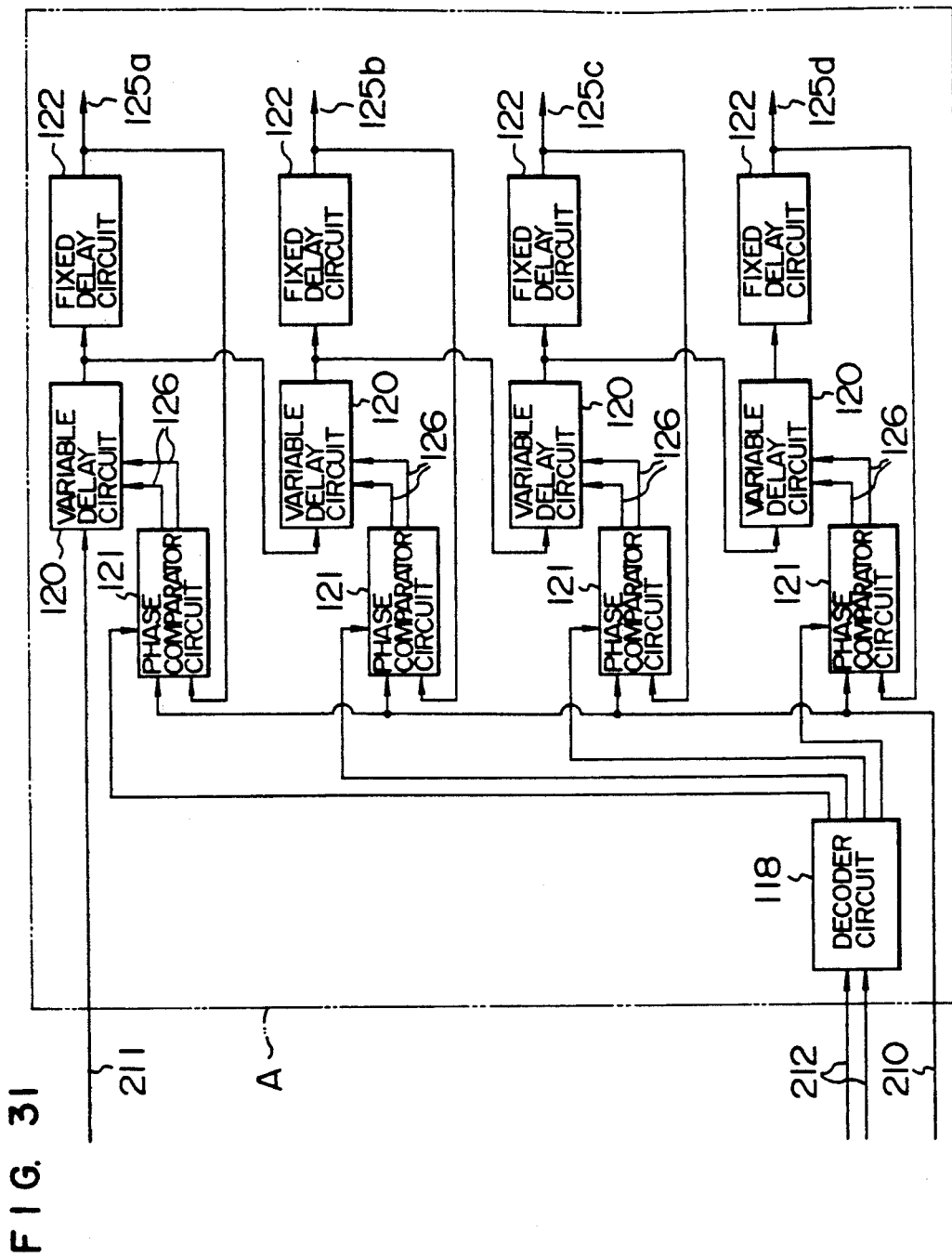

FIG. 31 shows another embodiment of the phase adjusting circuit in the destination A or B included in the embodiment of FIG. 29 and includes a fixed delay circuit 122 in the stage next to the variable delay circuit 120. If a minimized delay time of the variable delay circuit 120 exceeds the phase differences between clock signals, a configuration of FIG. 31 in which the delay time of the fixed delay circuit 122 is progressively reduced downward in the diagram, is recommended. The fixed delay circuit 122 is realized by connecting several stages of gate circuits in series. In FIG. 31, the inputs of the variable delay circuit 120 may be connected directly to the non-adjusted clock signal 211.

FIG. 32 shows another embodiment of the system shown in FIG. 29 for supplying a clock signal 211 rough in phase accuracy separately for each phase from a clock source 111. In the case of FIG. 32, there are an increased number of signal lines required between the clock source 111 and each of the destinations A and B, but only the reference signal line 210 requires accurate phase adjustment. The configuration such as shown in FIG. 32 is effective when it is desired to render the period of a clock signal variable over a wide range or when a variable delay circuit with a wide variable range is not usable. As an example of the latter, it may be desired to apply the present invention by dividing the parts from the clock source to the end destinations into two or more stages, or specifically, while applying the present invention to the parts from the clock source 111 to a relay circuit on each wiring board, it may be desired further to apply the present invention to the parts between the relay circuit and each LSI mounted on the wiring board. In such a case, any of the circuits shown in FIGS. 29 to 31 which can save the number of signals is applied from the clock source 111 to the relay circuit, and a configuration such as shown in FIG. 32 which saves the scale of the variable delay circuit 120 to the part from the relay circuit to each LSI.

Figure 33:
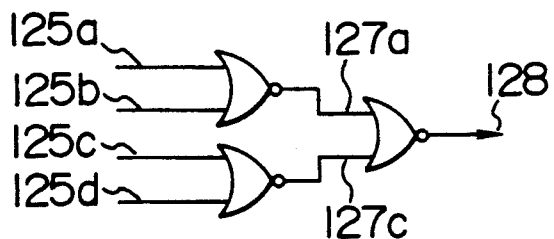
FIG. 33 is a diagram showing a circuit configuration for adding a function to the circuits of FIGS. 29 to 32.
Figure 34:
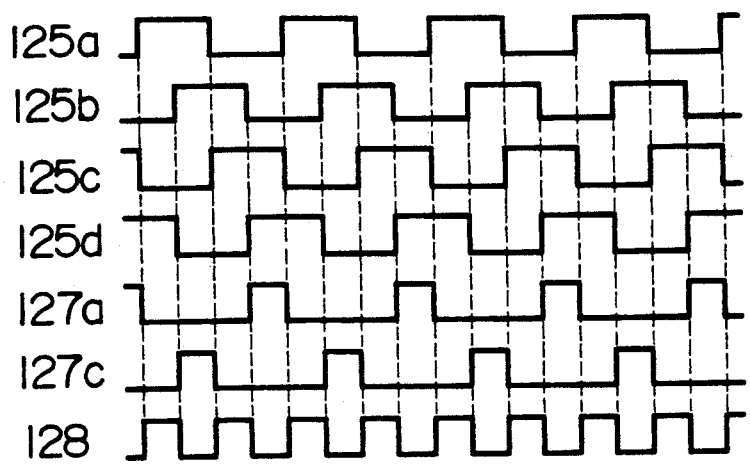
FIG. 34 shows waveforms for explaining the operation of the circuit of FIG. 33.

FIG. 33 shows an example of a method for producing a clock signal 128 higher in frequency than the multiphase clock signals 125a to 125d high in phase accuracy produced according to the present invention, by use of the latter. When four-phase clock signals 125a to 125d with phase intervals are applied to points 125(a) to 125(d) in FIG. 33, a clock signal with double period is produced at an output 128 as shown in FIG. 34. As a result, while only a signal of low frequency is being sent through the long signal line from the clock source 111 to each destination A or B (where a high-frequency signal is hard to pass), a clock signal several times higher in frequency may be produced in each destination A or B. In such a case, a circuit equivalent in delay time to the circuit of FIG. 33 is desirably inserted in the line for applying the reference signal 210 to the phase comparator circuit 121. Also, the NOR circuit used in the example shown in FIG. 33 may of course be replaced by a NAND circuit or an exclusive-OR circuit with equal effect. If the clock signals of four phases applied to the points 125(a) to 125(d) in FIG. 33 are supplied in the conventional methods, it would be difficult to keep equal inter-phase distance thereby deteriorating the periodicity of the clock signals after multiplication. The method of supplying them used in the system according to the present invention, by contrast, is accompanied by a variation in inter-phase distance only almost equal to a phase error, thereby improving the periodicity of the signals multiplied.

Figure 35:
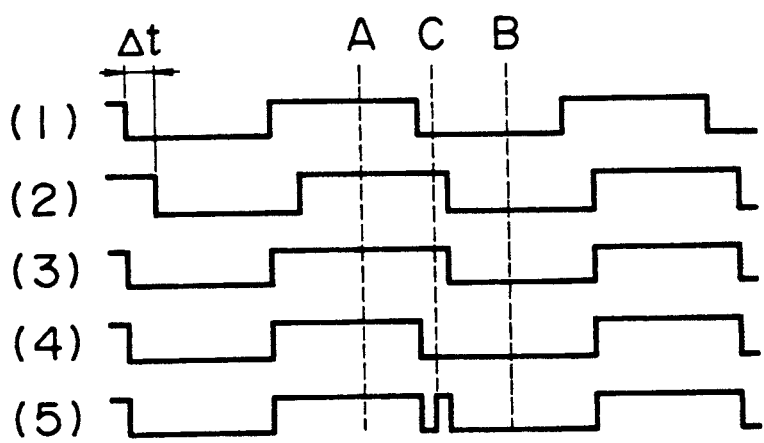
FIG. 35 is a diagram showing waveforms for explaining the operation of a variable delay circuit.

Now, explanation will be made of a hazard caused in switching the delay time of the variable delay circuit under digital control and a method of preventing the same. FIG. 35 shows an example of output waveforms produced from a variable delay circuit under digital control. (1) represents a case with a short delay time, and (2) an output waveform with a long delay time. The time lag Δt between these two outputs provides a switching width. Assume that the waveform (1) with short delay time is switched to the waveform (2) with long delay time when both waveforms (1) and (2) are "high" (that is, at a time point A in FIG. 35). The resulting output, as shown in (3) of FIG. 35, takes the same waveform as (1) before time point A and the same waveform as (2) after time point A while the number of pulses remains unchanged. The result is substantially the same as the switching at time A if the delay time is switched when both waveforms are "low" (that is, at time point B in FIG. 35) as shown by an output waveform thereof in (4). In the case where the delay time is switched at time point C when one waveform is "high" and the other "low", however, a short pulse is generated before and after the switching as shown in (5), thereby changing the total number of pulses. This phenomenon is what is called a "hazard" and is a probable cause of a malfunction. In conventional variable delay circuits of digital control type, a hazard is unavoidable as the delay time is switched in a way irrespective of an input or output signal, and it is necessary to avoid the effect thereof by suspending the control operation after completion of phase adjustment. If the switching of the delay time is effected always at time point A or B shown in FIG. 35, however, it will be possible to avoid a hazard. An example of a circuit configuration for achieving such a purpose is shown in FIG. 36.

In this circuit, an unadjusted clock signal 211 is applied as an input, and an output is produced as a clock signal 225. The process is divided into several blocks 250, for each of which the delay time is switched bit by bit. Each block has two signal lines of different transmission time, one of which is selected by a control signal 260 for each bit. The delay time switching width varies from one bit to another depending on the capacitance of a capacitor added to a node 252. Three latch circuits 261, 262, 263 are for preventing the delay time from being switched at other than time points A. In response to a command for lengthening or shortening the delay time by way of a control signal 126 from a phase comparator circuit 121 in FIG. 29, for instance, the control circuit 270 switches the control signal 260 for each bit at a timing irrespective of the signals passing the node 251 or 252. As a result of the signal passing through the latch circuit 261 to the extreme left, the voltage appearing at the node 281 undergoes a change not more than a half cycle of the low voltage level at node 253. Further, the voltage appearing at the node 282 through the latch circuit 262 in the second stage is changed only when the node is at low level. Since the nodes 252 and 253 are opposite in polarity, however, both the nodes 281 and 282 are adapted for simultaneous change only for a very short time. In fact, the node 282 is capable of changing only for a short time immediately after the node 252 becomes "low". Similar delay procedures through several stages make it possible to prevent the voltage at the node 283 from changing other than when the node 252 is "high". Thus the voltage at the node 285 is capable of changing only for a moment immediately after the node 253 has become "low", which moment is determined primarily for each period of the input signal. If an arrangement is so made that both the nodes 251 and 252 become "high" at such a moment, therefore, the delay time never fails to switch at time point A in FIG. 35, thereby preventing the hazard. A configuration is also possible to switch the delay time at time point B also, but only on condition that it is necessary to make sure that both the nodes 284 and 285 do not become "high" at the same time. FIG. 36 shows an example in which the part for switching the line between the nodes 251 and 252 includes a NOR circuit. If this NOR circuit is to be replaced by a NAND circuit, an arrangement is necessary to switch the delay time at time point B or to switch the delay time at time A while at the same time preventing both the nodes 284 and 285 from becoming "low" at the same time. FIG. 36 shows a case including a capacitor for changing the delay time. If it is desired to increase the switching width, however, a change in the number of gates to change the delay time is more preferable for preventing deterioration of waveforms. Further, the effect of a hazard can be prevented more positively by combined use of a method of stopping the control of the variable delay circuit 21 after completion of phase adjustment and a method using the circuit of FIG. 36 at the same time.

Figure 36:
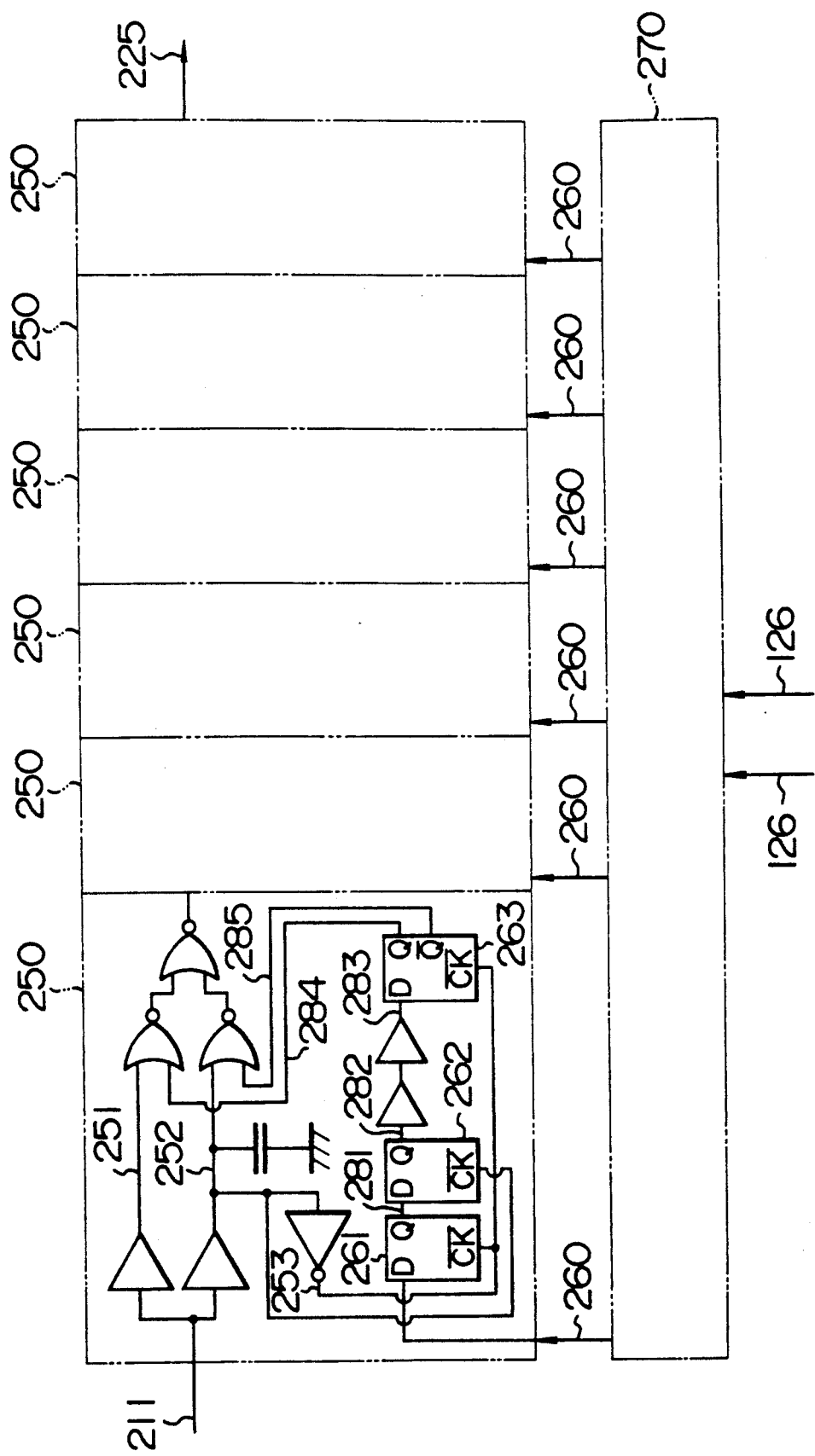
FIG. 36 is a circuit diagram showing an example of improvement in the variable delay circuit.

The circuit of FIG. 36, in which reference numerals identical to those in FIGS. 29, 31 and 32 are used for identical or equivalent component parts, may be used as the variable delay circuit in FIG. 1, 6, 10, 11, 12, 15, 16, 17, 18, 20 or 28.

Figure 37:
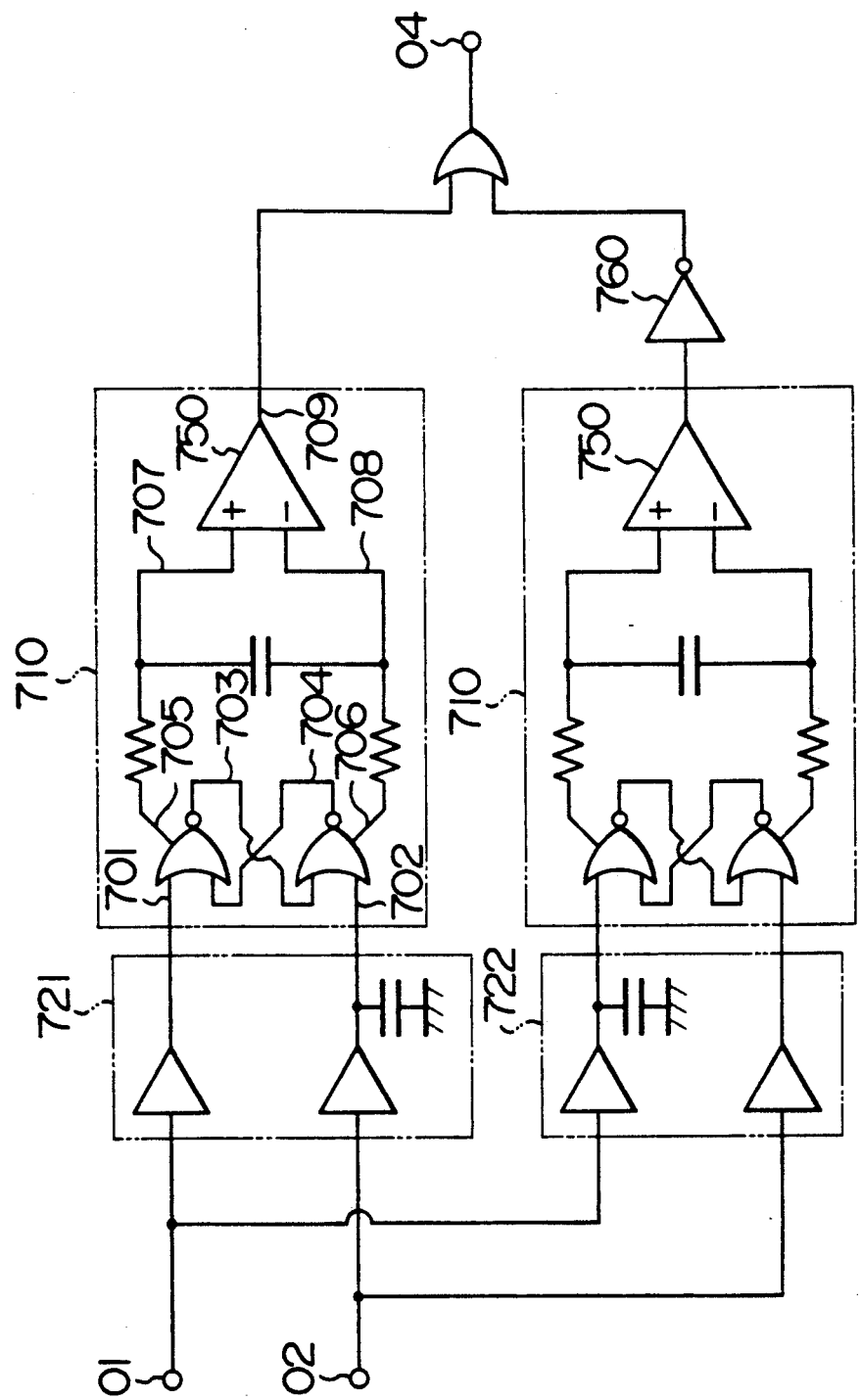
FIG. 37 is a circuit diagram showing an embodiment of a phase difference detection circuit used with a clock signal supply system according to the present invention.

The circuit shown in FIG. 37 includes two phase difference detection circuits for achieving the fourth and fifth objects of the present invention by being added to the phase adjusting circuit A, B or C in the clock signal supply system according to each of the embodiments described above. In this circuit, a received clock signal and a received reference signal are applied to each of the phase difference detection circuits having different phase difference detection sensitivity characteristics for detecting the degree (amount) of a phase difference.

Specifically, in the case where two signals having substantially equal phases are applied to two phase comparator circuits asymmetric in threshold value against the phase difference between two input signals, a result of decision determined by the asymmetry of the phase comparator circuits is produced irrespective of the phase relationship between the two signals. When the phase difference between the two signals exceeds a certain degree (specifically, more than the difference in symmetry between the phase comparator circuits), however, the right result of decision corresponding to the phase relationship between the two signals is produced. The embodiment of FIG. 37 utilizes this fact.

In FIG. 37, numeral 01 and 02 designate terminals impressed with a phase-adjusted clock signal and a phase-adjusted reference signal respectively, numeral 04 a terminal for producing an alarm signal, and numeral 710 vertically symmetric phase comparator circuits. Numerals 721, 722 designate parts for applying the phase-adjusted clock signal and the received reference signal to the phase comparator circuits 710 with different transmission time. In the embodiment of FIG. 12, for example, the input terminals 01 and 02 are preferably connected to the output of the frequency-dividing circuit 1203 and the received reference signal sent via the second signal line 1207 respectively.

Figure 38:
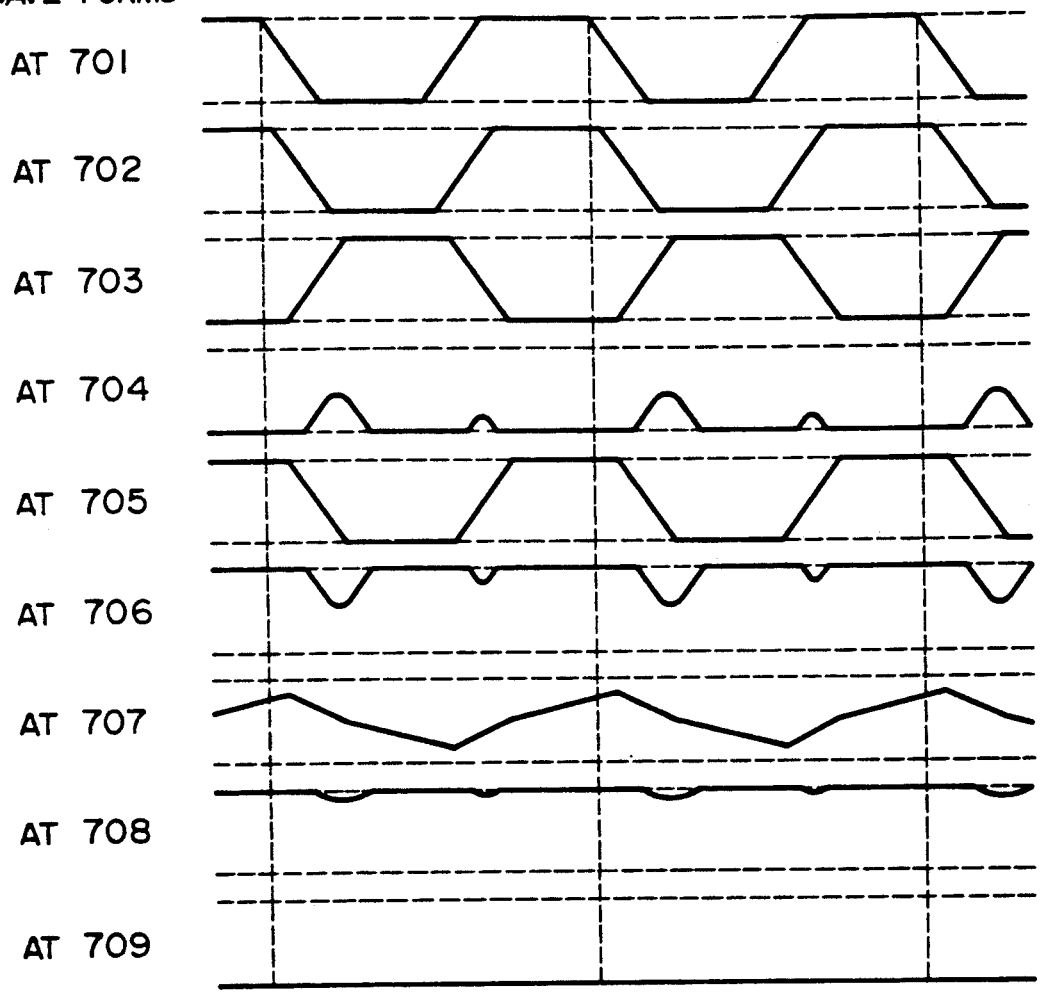
FIGS. 38 and 41 show waveforms for explaining a part of the operation of the circuits shown in FIGS. 37 and 40 respectively.

Now, the operation of this circuit will be explained. Assume that the phase-adjusted clock signal and the received reference signal applied to the input terminals 01 and 02 have the same phase. In the upper phase comparator circuit 710, the time before the signal applied to the input terminal 02 is transmitted to the node 702 is longer than the time required before the signal applied to the input terminal 01 is transmitted to the node 701, and therefore as shown in FIG. 38, the phase of the signal applied to the node 702 lags somewhat behind the phase of the signal applied to the node 701. Then, the waveform appearing at the node 703 is substantially inverted and takes a form delayed about one gate, while the waveform appearing at the node 704 is an inverted logic sum of the waveforms at 702 and 703 delayed one gate and therefore almost always assumes a low level. Also, waveforms appearing at nodes 705 and 706 take forms inverted from those waveforms appearing at the nodes 703 and 704 respectively. When these waveforms are passed through an integration circuit including a resistor and a capacitor in subsequent stage, the waveforms appearing at the nodes 707 and 708 are an average of those appearing at the nodes 705 and 706 respectively. While the waveform appearing at the node 707 assumes an intermediate level, the waveform appearing at the node 708 is substantially "high" in level. When these waveforms are applied to a differential amplifier 750, the signal appearing at 709 is always "low" in level. In the case where the phase-adjusted clock signal and the received reference signal are applied through a circuit 722, the signal applied to the lower phase comparator circuit 710 has an opposite phase relationship from the signal applied to the upper phase comparator circuit 710. As a result, a "high" signal is always produced from the lower phase comparator circuit 710. This signal after being applied through an inverter 760 is "low" in level, so that a logic sum of these two signals, that is, a "low" output is produced from an alarm signal output terminal 04.

Now, assume that the phase of the phase-adjusted clock signal is retarded from that of the received reference signal and the difference therebetween exceeds the difference in signal transmission time through the circuit 721 (which time difference is called the "dead band"). The phase relationship between the signals applied to the nodes 701 and 702 of the upper phase comparator circuit 710 is reversed, and a "high" signal appears at the node 709. A "high" signal is thus produced at the alarm signal terminal 04, and a phase shift more than the dead band is detected. Assume, on the contrary, that the phase of the phase-adjusted clock signal leads that of the received reference signal and the difference therebetween has exceeded the difference in signal transmission time in the circuit 722 (which is also called the "dead band"). Then a "high" signal is produced at the alarm signal terminal 04 through the lower phase comparator circuit 710. The circuit in FIG. 37 thus issues an alarm signal only when the phase difference between the phase-adjusted clock signal and the received reference signal is larger than the dead band of the circuit 721 or 722, and operates as a circuit issuing no alarm signal against a phase shift less than the dead band. The dead bands of the circuits 721 and 722 are known in advance, and therefore whether the degree of this phase difference is larger or smaller than a value set in advance is detectable.

In the case where the phase difference between the phase-adjusted clock signal and the received reference signal exceeds the dead band and it is desired to detect which signal leads, outputs of the upper and lower phase comparator circuits 710 may be taken out separately from each other or alternatively a third symmetric phase comparator circuit 710 may be added for direct phase comparison between the input signals. The latter means assures more accurate phase readjustment that may be effected after an alarm signal is received.

Figure 39:
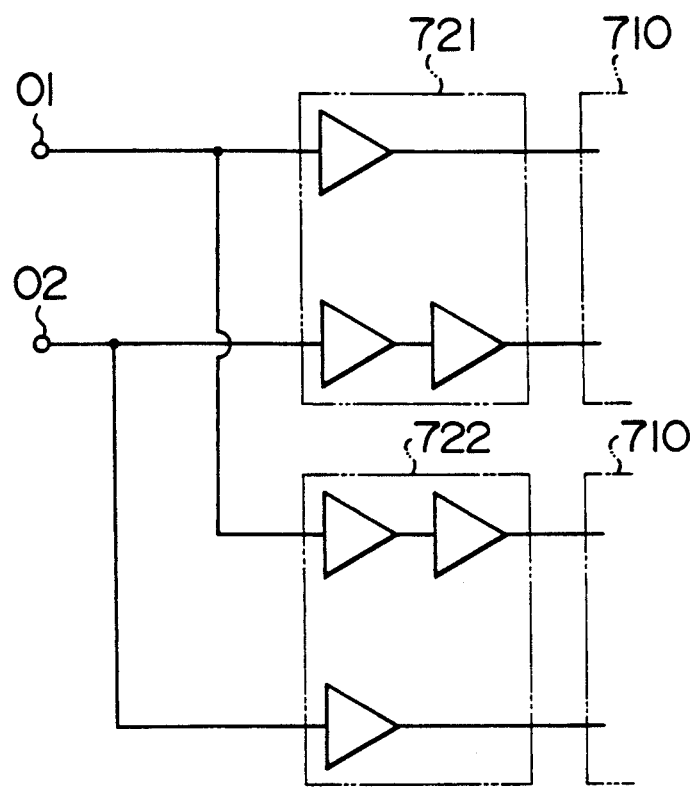
FIG. 39 shows a part of another embodiment of the phase difference detection circuit.

Also, if the positive and negative sides of the signals applied to the differential amplifier circuit 750 of the lower phase comparator circuit 710 are reversed, the need of the inverter 760 in the subsequent stage is eliminated. The capacitance of the circuit 721 or 722 makes up a load for increasing the signal transmission delay time and may be provided by a capacitor or wiring capacity or by connecting a dummy gate for increased fan-out or such other equivalent capacitor. The magnitude of the dead band can be course be changeable depending on the magnitude of such a capacitance load. If it is desired to increase the dead band considerably, this part may be replaced with a circuit shown in FIG. 39 to form a dead band by the difference in the number of gates. In this case, too, the size of the dead band may be changed by changing the number of gates. Further, the sizes of the dead band for the upper and lower phase comparator circuits may not be coincident with each other, and it is also possible to reduce only the dead band for the lower phase comparator circuit to zero.

Figure 40:
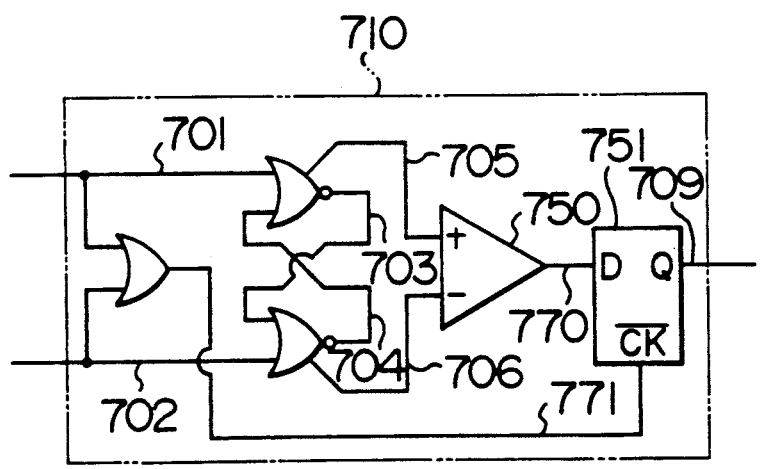
FIG. 40 shows a part of another embodiment of the phase comparison circuit or a phase difference detection circuit.

FIG. 40 shows another embodiment of the phase comparator circuit 710 in FIG. 37. This circuit includes more devices than the one in FIG. 37 but has the advantage that it can be produced in fully digital form and is usable also when the period of an input signal is very long. Specifically, the phase comparator circuits 710 used in FIG. 37 which includes an analog integration circuit, is required to have an increased capacitance for increasing the time constant of the integration circuit when the period of the input signal is long. When the period lengthens beyond a certain level, therefore, the capacitor occupies a larger space and becomes difficult to arrange within an integrated circuit. The circuit of FIG. 40 is an improvement over such an inconvenience. The operation of this particular circuit will be explained below.

Figure 41:
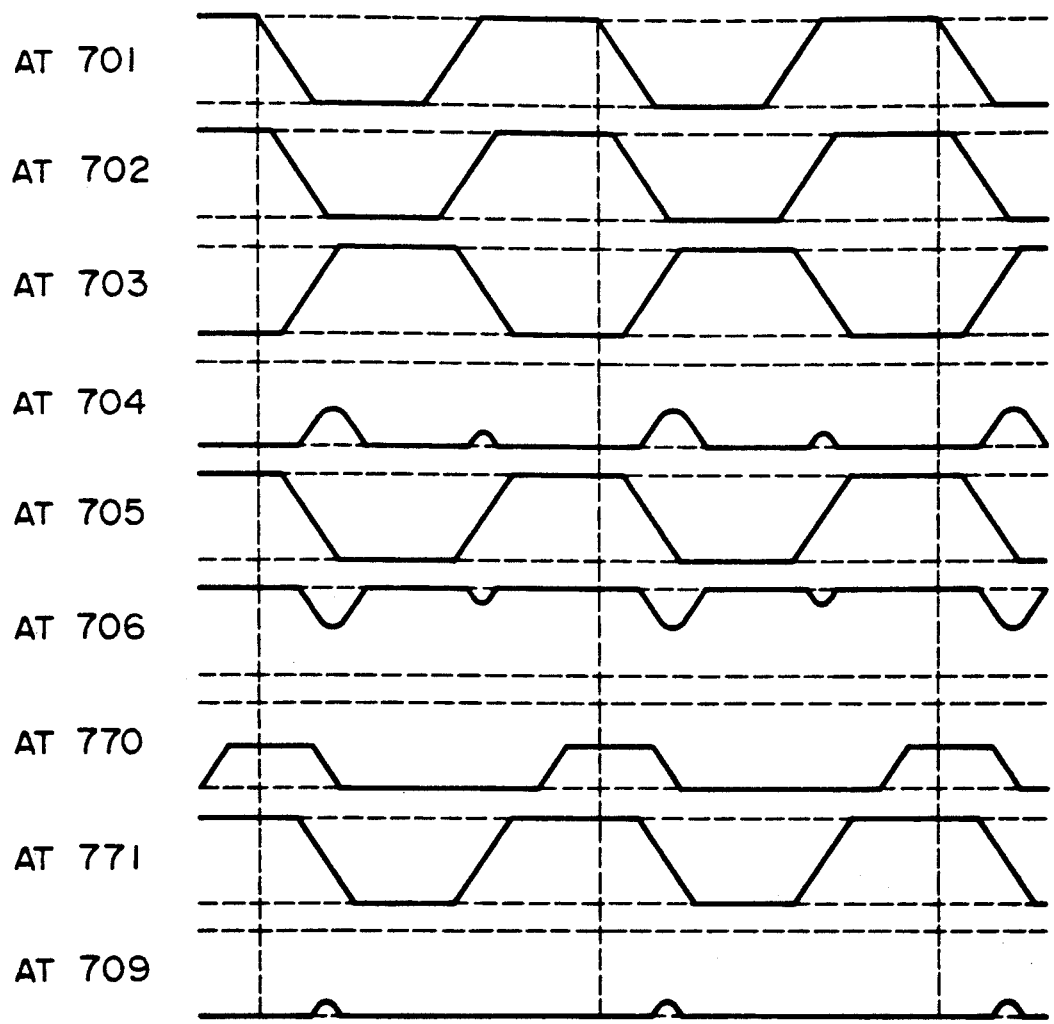

In FIG. 40, the waveforms appearing at nodes 701 to 706 are similar to those (FIG. 38) in the circuit of FIG. 37. In the case of FIG. 40, however, the nodes 705 and 706 are connected directly to a differential amplifier 750, and therefore as shown in FIG. 41, when the nodes 701 and 702 are "low" (that is, when the node 705 is "low", and the node 706 "high"), the node 770 is "low", and when the nodes 701 and 702 are "high" (that is, when both the nodes 705 and 706 are "high"), the node 770 assumes an intermediate level. If a latch circuit 751 is used to take the waveform 770 in synchronism with the low level of both the nodes 701 and 702, therefore, the waveform appearing at the node 709 remains almost always "low". If the initial phase relationship between nodes 701 and 702 is opposite on the other hand, the waveform appearing at the node 709 remains almost always "high".

The phase comparator circuits 710 used in the circuit of FIG. 37 may take any other form such as the one used for control of a phase lock loop circuit so far as it has a function to compare the phase relationship between two signals. Nevertheless, the circuits o FIG. 37 or FIG. 40, which is similar in configuration to a digital logic circuit as compared with the circuit shown in FIG. 1, p. 11-8 of the Analog Data Manual of Signetics, are easier to include in a gate array. In addition, the circuits shown in FIG. 37 and FIG. 40 may be so constructed that the two NOR circuits cross connected may be replaced by two NAND circuits with equal effect.

Figure 42:
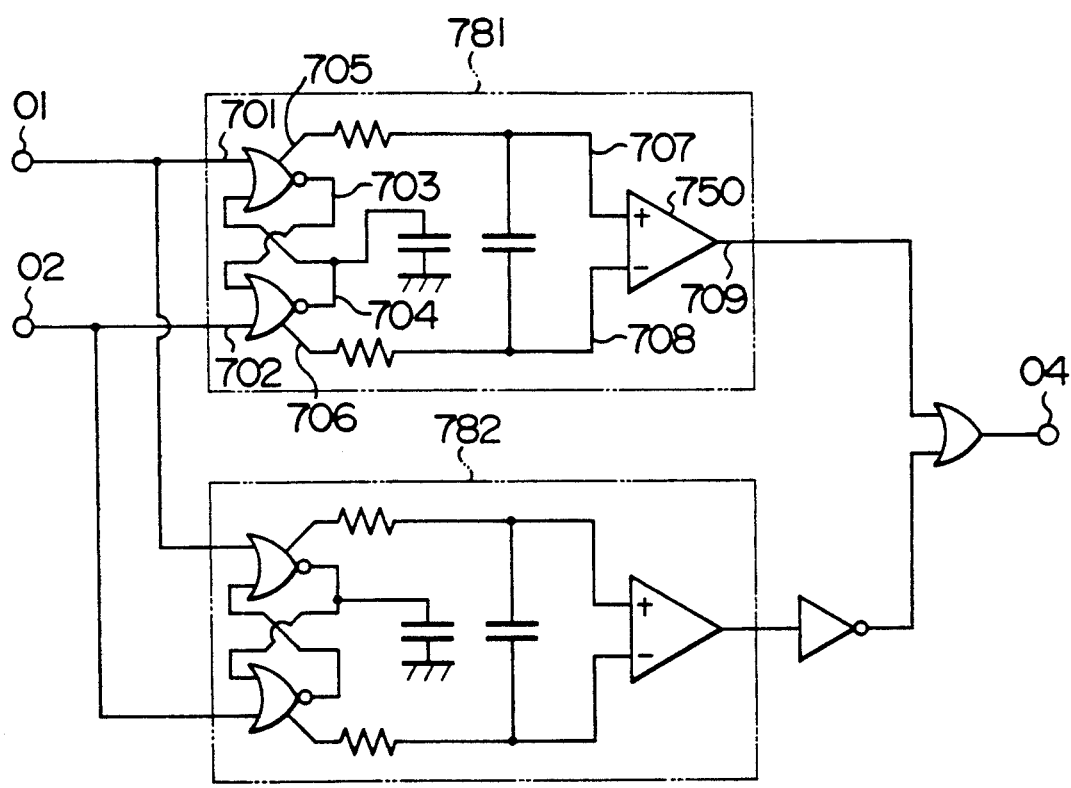

FIG. 42 shows a circuit according to another embodiment, in which phase comparator circuits 781 and 782 are asymmetric with each other. In FIG. 42, assume that signals of the same phase are applied to nodes 701 and 702. In the upper phase comparator circuit 781, the voltage at the node 703 undergoes a change earlier than the voltage at the node 704, so that the circuit is equivalent to the circuit of FIG. 37 in which the phase of the signal applied to the node 701 is somewhat advanced. The lower phase comparator circuit 782, on the other hand, is equivalent to the circuit of FIG. 37 in which the phase of the signal applied to the node 701 somewhat lags. The circuit under consideration this functions in a manner similar to the circuit of FIG. 37.

Figure 43:
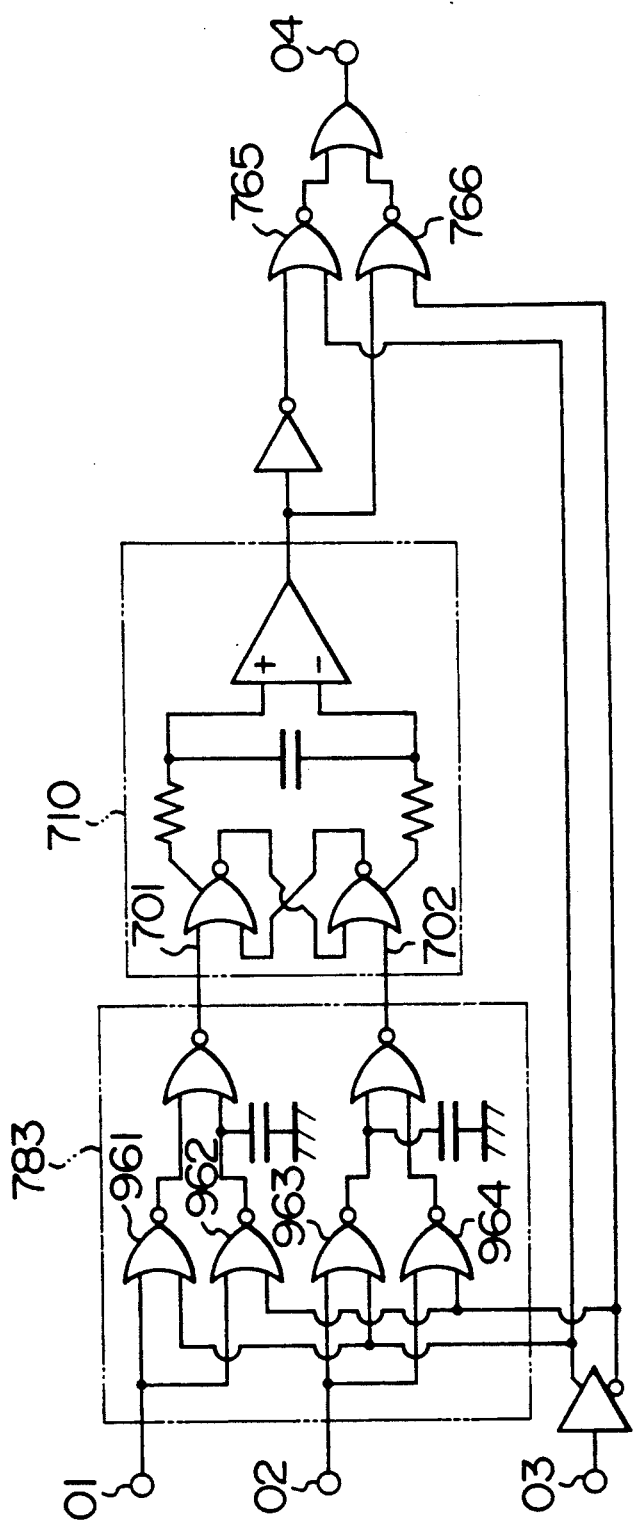

FIG. 43 is a diagram showing a phase difference detection circuit according to still another embodiment, in which the polarity of the dead band is switched depending on the control signal applied to a control terminal 03. When the control signal is "low", for instance, input signals to terminals 01 and 02 are applied through gate circuits 961 and 963 to the phase comparator circuit 710 respectively. In view of the fact that the line including the gate circuit 961 is shorter in signal transmission time than that including the gate 963, however, the difference makes up a dead band thereby to cause an operation similar to the upper half of the circuit in FIG. 37. In the case where the control signal at the terminal 03 is "high", by contrast, the function is similar to the lower half part of the circuit shown in FIG. 37. As long as a control signal sufficiently longer in period than the input signals is applied to the terminals 01 and 02, therefore, a function similar to the circuit of FIG. 37 may be provided by time division. Also, without switching both the transmission time of two input signals by a control signal, this circuit may be so alternatively configured that the transmission time of only one input signal is switched.

Figure 44:
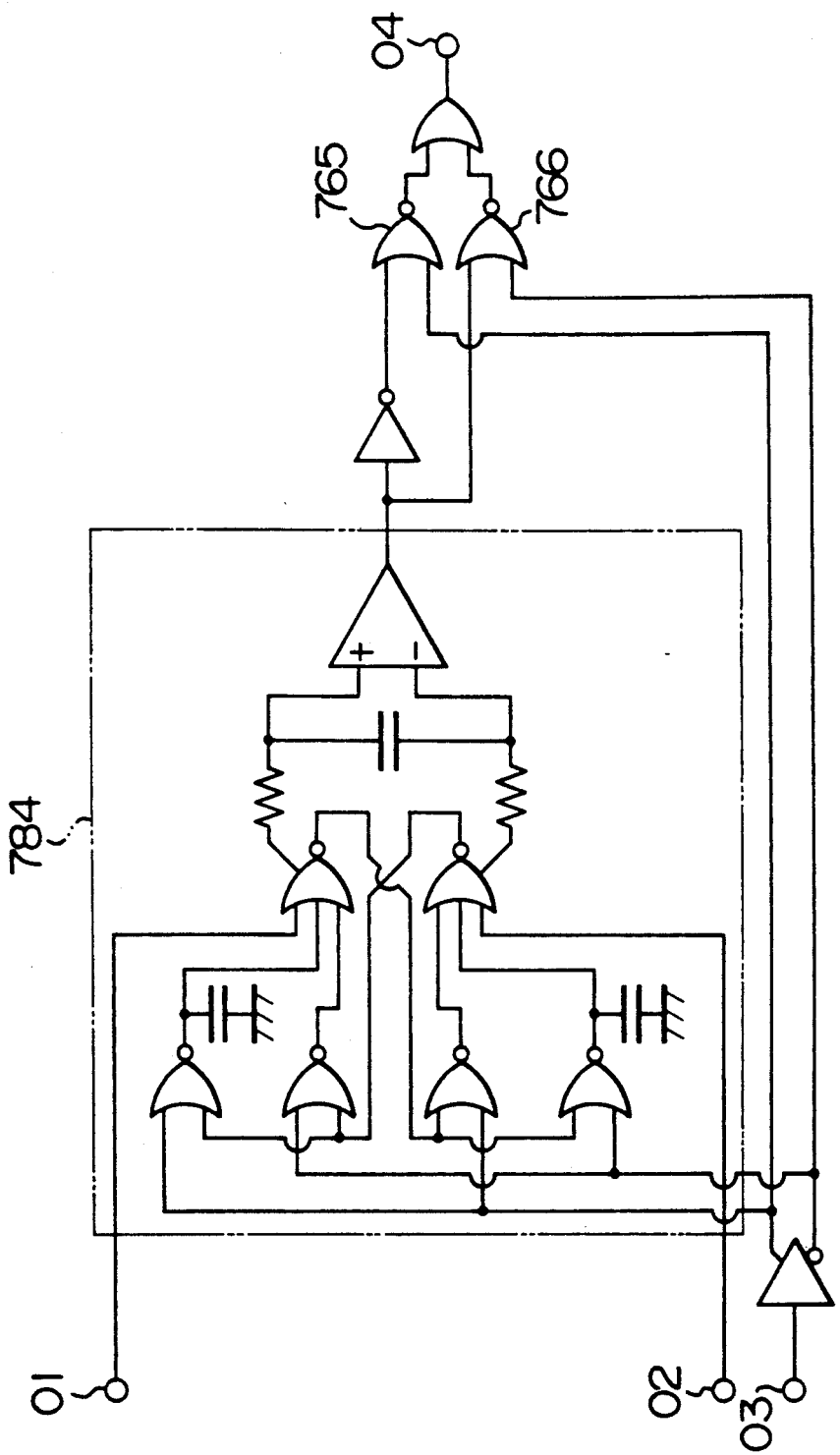

FIG. 44 is a diagram showing a phase difference detection circuit according to a further embodiment, which is adapted for time division operation by a control signal in the circuit of FIG. 42. The operation of this circuit is basically identical to that explained with reference to FIG. 43.

Figure 45:
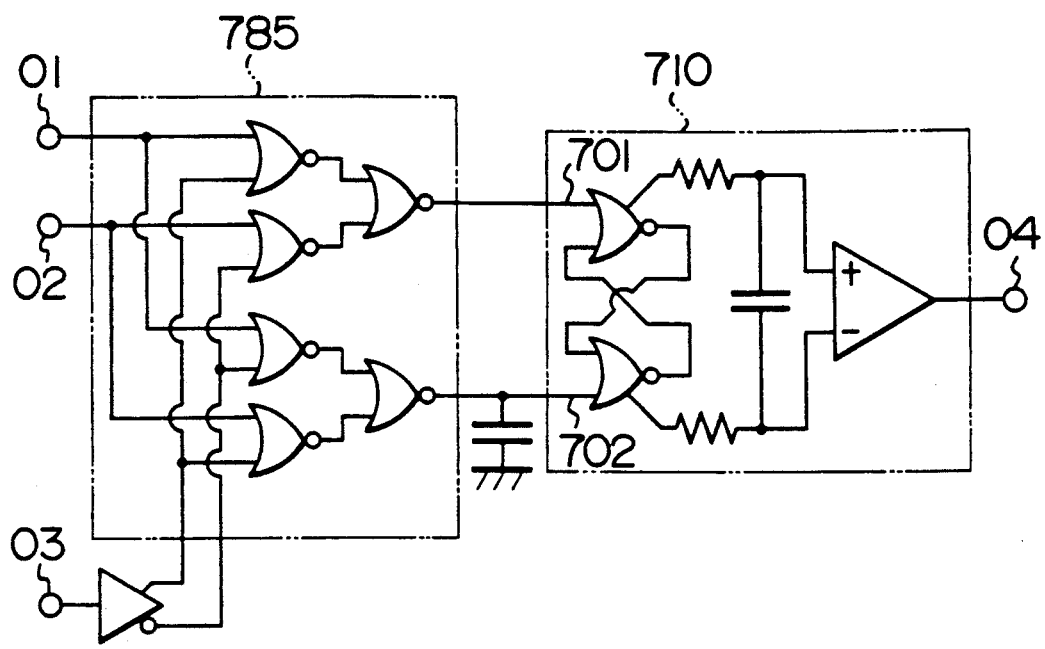

FIG. 45 shows a circuit according to still another embodiment of the present invention, in which the connections between input signals at terminals 01 and 02 and the phase comparator circuits 710 are switched by time division. More specifically, when the control signal at terminal 03 is "low", the input signal at terminal 01 is connected to the node 701 of the phase comparator circuit 710, and the input signal at terminal 02 to the node 702. Since the transmission time through the line of the signal applied to the node 701 is shorter than that of the signal applied to the node 702, however, the difference makes up a dead band thereby causing a function similar to the upper half part of the circuit shown in FIG. 37. Also, when the control signal at terminal 03 becomes "high", the input signal at terminal 01 is connected to the node 702, and the input signal at terminal 02 to the node 702. In view of the fact that the signal transmission time is longer through the line of the signal applied to the node 702 than that applied to the node 701, the circuit functions as if the positive and negative sides of the differential amplifier circuit 750 in the lower half part of the circuit shown in FIG. 37 are interchanged with each other. The circuit under consideration is therefore also capable of having a function similar to the circuit of FIG. 37 by time division like the circuit of FIG. 43. As will be seen from FIG. 45, the number of circuit components is further reduced as compared with the circuit of FIG. 43.

FIG. 46 shows a still further embodiment of a phase difference detection circuit comprising a multiplicity of circuits having different dead bands. The use of the circuit shown in FIG. 46 permits not only the detection as to whether the phase difference of the input signals at terminals 01 and 02 exceed a tolerance but also the detection of the degree of the phase difference at the same time. Also, it is also possible to use this circuit for manual phase adjustment free of any visual error which might be caused with an oscilloscope. Specifically, in the circuit of FIG. 46, a signal appearing at the output terminal 05 of each phase comparator circuit 710 is displayed by appropriate means such as a light-emitting diode and a reference signal is applied to the input terminal 01 with the input terminal 01 as a probe brought into contact with a point requiring phase adjustment (clock signal line). In this way, the level of the output terminals 05 is determined in accordance with the phase difference between the reference signal and the signal at the point to be phase adjusted, thereby eliminating the chance of visual error.

Figure 47:
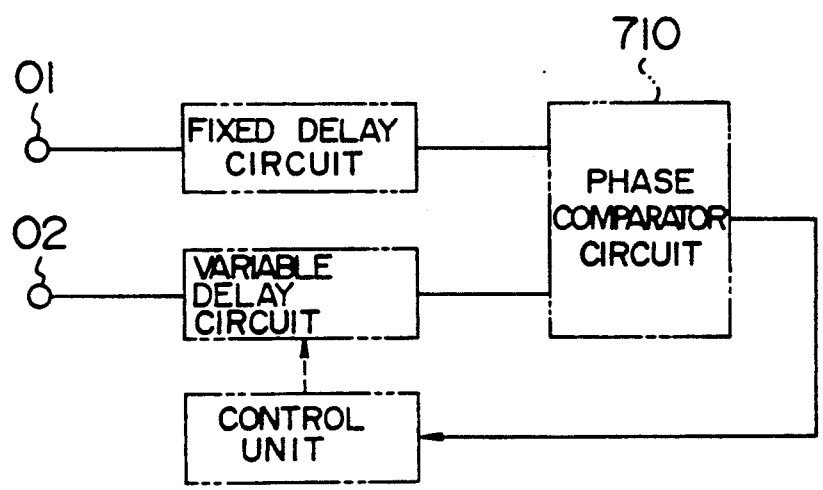

FIG. 47 is a diagram showing a phase difference detection circuit according to a still further embodiment, in which a variable delay circuit is included to save the number of devices constituting the circuit of FIG. 46. The control means of this circuit so operates that the delay time of the variable delay circuit is shortened in the case where the phase comparator circuits 710 decides that the phase of the input signal at terminal 01 is advanced, and the delay time of the variable delay circuit is lengthened when the decision is reverse. The signals applied to the phase comparator circuits 710 are thus always controlled to substantially the same level, and therefore if the prevailing difference in delay time between the variable delay circuit and the fixed delay circuit is determined, the degree of the phase difference is also known. By using a circuit controllable with an analog or digital voltage such as shown in FIGS. 2 to 5 or FIG. 36 as a variable delay circuit, the degree of the phase difference between two input signals can be known from the level of a control voltage. In the circuit of FIG. 47, it is also possible to change the delay time thereof manually by using a variable-length air line as a variable delay circuit.

We claim:

1. A clock signal supply system comprising:
   a clock signal oscillator producing a clock signal;
   a plurality of first means for receiving said clock signal applied thereto, said clock signal having an associated phase, and each of said first means further including means for adjusting the phase of the clock signal and producing an output of phase-adjusted clock signals from the received clock signal;
   a plurality of first signal lines for transmitting the clock signals produced from the clock signal oscillator to each of the first means;
   second means for generating a reference signal in predetermined relationship wit the clock signals produced from the clock signal oscillator, said second means including a first reference signal circuit and a second reference signal circuit;
   a pair of second signal lines connecting said first and second reference signal circuits to each of said first means and to each other, and transmitting the reference signal from the second means to each of the first means, said second means generating the reference signal in either of a first or second direction along one of said pair of second signal lines between said first and second reference signal circuits;
   wherein each of said first means includes means for comparing said phase-adjusted clock signal produced form the clock signal received through an associated first signal line, with the reference signal transmitted by said one of the second signal lines, and means for adjusting the phase of the clock signal received through the first signal lie into a predetermined phase relationship with the reference signal based on the results of the comparison by said means or comparing;
   further wherein a first signal produced by said first reference signal circuit is transmitted along a first one of said pair of second signal lines in a first direction, and a second signal produced by said second reference signal circuit is transmitted in a second direction, opposite to the first direction, along the other of said pair of second signal lines; and
   wherein said means for comparing compares said phase-adjusted clock signal that is produced from the clock signal received through the first signal line with said first signal received through said first one of said pair of second signal lines, and compares said phase-adjusted clock signal produced from the clock signal received through the first signal line with said second signal received through the second one of said pair of second signal lines, thereby to adjust the phase of the clock signal in such a manner to attain a predetermined phase relationship between the clock signal received through said first signal line and said first and second signals received through said pair of second signal lines respectively.

2. A clock signal supply system according to claim 1, wherein said comparing means includes
   means for detecting the phase difference between said first signal received from said first one of said pair second signal lines and the phase adjusted clock signal produced from the clock signal received through the first signal line as a first phase difference, and
   means for detecting the phase difference between the second signal received from said second one of said pair of second signal lines and said phase adjusted clock signal produced from the clock signal received through the first signal line as a second phase difference.

3. A clock signal supply system according to claim 2, wherein each of the plurality of first means adjusts the phase of the clock signal received in such a manner that the detected first phase difference ad the detected second phase difference have values opposite in polarity and equal to each other in absolute value.

4. A clock signal supply system comprising a:
   means for generating a clock signal;
   means for generating a reference signal on the basis of said clock signal, a frequency of said reference signal being lower than a frequency of said clock signal;
   a plurality of means for comparing phase difference between two signals received at said means for comparing, and as a result of the comparison producing a phase control signal;
   a plurality of means, responsive to a received clock signal, for adjusting said received clock signal according to said phase control signal so as to output an adjusted clock signal;
   first means for transmitting said clock signal from said means for generating a clock signal to each of said plurality of means for adjusting;
   second means for transmitting said reference signal from said means for generating a reference signal to each of said plurality of means for comparing phase difference;
   a plurality of means dividing the frequency of said adjusted clock signal; and
   said means for comparing produces said phase control signal according to a phase difference between said reference signal transmitted from said second means and said frequency-divided signal produced by one of said means for dividing the frequency.

5. A clock signal supply system according to claim 4, wherein the frequency of said clock signal generated by said means for generating a clock signal, is an integral multiple, of at least two, of the frequency of said reference signal generate by said means for generating a reference signal.

6. A clock signal supply system according to claim 4, further comprising means, responsive to the output of said means for adjusting, for latching the output of said means for dividing the frequency of the receiving clock signal so as to produce an output of the frequency divided clock signal in synchronism with said output of said means for adjusting, for input to said means for comparing phase difference.

7. A clock signal supply system comprising:
means for generating a clock signal;
means for generating a reference signal whose frequency is lower than a frequency of said clock signal;
a plurality of means for comparing phase difference between two signals received at said means for comparing and as a result of the comparison producing a phase control signal;
a plurality of means, responsive to a received clock signal, for adjusting said received clock signal according to said phase control signal so as to output an adjusted clock signal;
first means for transmitting said clock signal from said means for generating a clock signal to each of said plurality of means for adjusting;
second means for transmitting said reference signal from said means for generating a reference signal to each of aid plurality of means for comparing phase difference, said second means being arranged to transmit said reference signal in substantially equal transmission time to each said means for comparing phase difference;
wherein said phase control signal is produced according to the phase difference between said reference signal, transmitted from said second means and the output of said means for adjusting;
means for counting the output of said means for adjusting to output multi-phase clock signals; and
means, responsive to the output of said means for adjusting, for latching said multi-phase clock signals so as to produce an output of said multi-phase signals in synchronism with said output of said means for adjusting, one of said multi-phase clock signals being supplied to said means for comparing phase difference.

8. A clock signal supply system comprising:
means for generating a clock signal;
means for generating a reference signal on the basis of said clock signal from said means for generating a clock signal, a frequency of said reference signal being lower than a frequency of said clock signal;
a plurality of phase adjusters;
first signal lines transmitting said clock signal from said means for generating a clock signal t each of said plurality of phase adjusters;
a pair of second signals lines, one of said pair of second signal lines transmitting said reference signal from said means for generating a reference signal to each of said plurality of phase adjusters;
each of said plurality of phase adjusters including a variable delay circuit, a frequency divider and a phase comparator circuit, said variable delay circuit receiving said clock signal transmitted from said first signal lines and delaying said clock signal according to a control signal, said frequency divider dividing a frequency of an output of said variable delay circuit, said phase comparator circuit comparing an output of said frequency divider with said reference signal transmitted from said one of said pair of second signal lines and detecting a phase difference between said output and said reference signal so as to produce said control signal representing said phase difference to said variable delay circuit.

9. A clock signal supply system according to claim 43, wherein said means for generating a reference signal includes means for dividing the frequency of said clock signal.

10. A clock signal supply system according to claim 8, wherein said means for generating a reference signal comprises first and second reference signal circuits, connected to each other and to each of said phase adjusters by said pair of second signal lines, said pair of second signal lines, being bidirectional between said first and second reference signal circuits.

11. A clock signal supply system used in a computer system having a plurality of destination blocks which are destinations of a supplied clock signal, comprising:
means for generating a plurality of clock signals having phase different from each other;
a first signal line transmitting one of said clock signals from said means for generating to each of the blocks;
means for successively generating a select signal alternately designating one of said clock signals;
a second signal line transmitting said select signal form said select signal generating means to each of the blocks;
means, responsive to said select signal, for generating a reference signal, said reference signal being a phase reference of the clock signal designated by said select signal;
a third signal line transmitting said reference signal from said reference signal generating means to each of the blocks; and
a plurality of means one disposed in each of the blocks, for reproducing the plurality of clock signals having difference phases on the basis of the clock signal transmitted through said first signal line in accordance with the select signal transmitted through said second signal line and the reference signal transmitted through said third signal line.

12. The clock signal supply system according to claim 11, wherein said clock signal generating means includes an oscillator generating an original clock signal and a dividing circuit dividing a frequency of said original clock signal and providing said plurality of clock signals having phases difference from each other.

13. The clock signal supply system according to claim 12, further comprising a latch circuit for latching said reference signal from said reference signal generating means in synchronism with said original clock signal and for sending out said latched reference signal to said third signal line.

14. The clock signal supply system according to claim 12, wherein each of said plurality of reproducing means includes:
a plurality of variable delay circuits connected in series;
a plurality of comparator circuits wherein a comparator circuit is provided in correspondence with each of said delay circuits and receives an output of the corresponding delay circuit and said reference signal as input signals; and
a decoder circuit for successively designating one of said plurality of comparator circuits in accordance with said select signal, said comparator circuit designated by said decoder circuit controlling the delay time in the corresponding delay circuit so as to cause a phase of the output of said delay circuit to coincide with the phase of said reference signal, each of the outputs of said delay circuits being outputted as the reproduced clock signals.

15. The clock signal supply system according to claim 12, wherein each of said plurality of reproducing means includes:
   a plurality of delay circuits, at least one of said delay circuits receiving said clock signal transmitted from said first signal line and outputting a phase adjusted clock signal;
   a plurality of comparator circuits, wherein a comparator circuit is provided in correspondence with each of said delay circuits and compares the phase of said phase adjusted clock signal with the phase of said reference signal; and
   a decoder circuit designating said comparator circuits successively in accordance with said select signal, wherein a comparator circuit designated by said decoder circuit controls the delay time in the corresponding delay circuit so as to cause a phase of the output of said delay circuit to coincide with the phase of said reference signal, each of the outputs of said delay circuits being outputted as the reproduced clock signals.

16. The clock signal supply system according to claim 12 wherein the frequency of said reference signal is lower than that of said clock signal.

17. A clock signal supply system used in a computer system having a plurality of destination blocks which are destinations of a supplied clock signal, comprising:
   means for generating a plurality of clock signal shaving phases difference from each other;
   a plurality of first signals lines for transmitting said clock signals from said clock signal generating means to each of said blocks;
   means for successively generating a select signal alternately designating one of said clock signals;
   a second signal line for transmitting said select signal from said select signal generating means to each of said blocks;
   means for generating a reference signal on the basis of one of said clock signals, said reference signal being a phase reference of the clock signal designated by said select signal;
   a third signal line transmitting said reference signal from said reference signal generating means to said one of said blocks; and
   means, disposed in said one of said blocks for receiving the plurality of clock signals transmitted through said plurality of first signal lines and adjusting the phases of said plurality of clock signals in accordance with select signals transmitted through said plurality of second signal lines and the reference signal transmitted through said third signal line to provide phase adjusted clock signals.

18. The clock signal supply system according to claim 17, wherein said clock signal generating means includes an oscillator generating an original clock signal and a dividing circuit dividing the frequency of said original clock signal and providing said plurality of clock signals having phases different from each other.

19. The clock signal supply system according to claim 18, further comprising a latch circuit disposed between said means for generating a reference signal and said third signal line and latching aid reference signal in synchronism with the original clock signal and sending out said latched reference signal to said third signal line as the reference signal to be transmitted to said one of said blocks.

20. The clock signal supply system according to claim 17, wherein said phase adjusting means includes;
   a plurality of variable delay circuits receiving said clock signals transmitted through said first signal lines and outputting the phase adjusted clock signals;
   a plurality of comparator circuits, each comparator circuit associated with one of said plurality of variable delay circuits and comparing the phase of said phase adjusted clock signals and the phase of said reference signal; and
   a decoder circuit successively designating one of said comparator circuits according to said select signal, said comparator circuit designated by said decoder circuit controlling the delay time in its associated delay circuit so as to cause a phase of the output of said associated delay circuit to coincide with the phase of said reference signal.

21. The clock signal supply system according to claim 17, wherein the frequency of said reference signal is lower than that of said clock signal.

* * * * *

UNITED STATES PATENT AND TRADEMARK OFFICE
CERTIFICATE OF CORRECTION

PATENT NO. : 5,184,027  
DATED : Feb. 2, 1993  
INVENTOR(S) : Noboru Masuda et al Page 1 of 4

It is certified that error appears in the above-indentified patent and that said Letters Patent is hereby corrected as shown below:

| Column | Line | |
|---|---|---|
| 1 | 35 | Change "constitutes" to --constitute--. |
| 2 | 19 | Change "JP-A-62-24410" to --JP-A-62-242410--. |
| 2 | 43 | After "not" insert --have--. |
| 2 | 53 | Change "admustment" to --adjustments--. |
| 2 | 58 | Change "detect in" to --detecting--. |
| 5 | 7 | Change "$B_1$ $C_1$" to --$B_1$ and $C_1$--. |
| 7 | 48 | Change "voltageof" to --voltage of--. |
| 7 | 54 | After "approach" delete "to". |
| 7 | 64 | After "approach" delete "to". |
| 8 | 46 | Change "(Ta-$T_1$)" to --{$T_a$ - $T_1$}--. |
| 9 | 65 | Change "computer" to --computers--. |
| 10 | 3 | After "ineffective" insert --made--. |
| 10 | 4 | Change "is formed for" to --be formed therefor--. |
| 10 | 5 | Change "is" to --be--. |
| 10 | 65 | After "embodiment." to not start paragraph. |
| 10 | 66 | After "FIG. 11" delete "following FIG. 10" |
| 11 | 18 | Change "difference" to --differences--. |
| 11 | 20 | Change "becomes" to --become--. |

UNITED STATES PATENT AND TRADEMARK OFFICE
CERTIFICATE OF CORRECTION

PATENT NO. : 5,184,027
DATED : Feb. 2, 1993
INVENTOR(S) : Noboru Masuda et al

It is certified that error appears in the above-indentified patent and that said Letters Patent is hereby corrected as shown below:

| Column | Line | |
|---|---|---|
| 12 | 68 | Change "sufficient" to --sufficiently--. |
| 13 | 13 | Change "proximite" to --proximate--. |
| 16 | 46 | Change "In" to --If--. |
| 17 | 68 | Change "receiving" to --received--. |
| 19 | 7 | Change After "125d" insert --,--. |
| 19 | 27 | After "distance" insert --,--. |
| 19 | 31 | After "only" insert --,--. |
| 22 | 51 | Change "can be course" to --can, of course, be--. |
| 23 | 31 | After "circuits" change "o" to --of--. |
| 23 | 32 | Change "is" to --are--. |
| 23 | 52 | Change "this" to --thus--. |
| 25 | 33 | Change "wit" to --with--. |

UNITED STATES PATENT AND TRADEMARK OFFICE
CERTIFICATE OF CORRECTION

PATENT NO. : 5,184,027
DATED : Feb. 2, 1993
INVENTOR(S) : Noboru Masuda et al

It is certified that error appears in the above-indentified patent and that said Letters Patent is hereby corrected as shown below:

| Column | Line | |
|---|---|---|
| 25 | 52 | Change "lie" to --line--. |
| 25 | 55 | Change "or" to --for--. |
| 26 | 14 | After "pair" insert --of--. |
| 26 | 28 | Change "ad" to --and--. |
| 26 | 31 | After "comprising" delete "a". |
| 26 | 63 | Change "generate" to --generated--. |
| 26 | 68 | Change "receiving" to --received--. |
| 27 | 23 | Change "aid" to --said--. |
| 27 | 50 | After "signal" change "t" to --to--. |
| 28 | 4 | Change "43" to --8--. |
| 28 | 18 | Change "phase" to --phases--. |

UNITED STATES PATENT AND TRADEMARK OFFICE
CERTIFICATE OF CORRECTION

PATENT NO. : 5,184,027
DATED : Feb. 2, 1993
INVENTOR(S) : Noboru Masuda et al

It is certified that error appears in the above-indentified patent and that said Letters Patent is hereby corrected as shown below:

| Column | Line | |
|---|---|---|
| 28 | 25 | Change "form" to --from--. |
| 29 | 33 | Change "signal shav-" to -- signals hav- -- |
| 29 | 34 | Change "difference" to --different--. |
| 30 | 21 | Change "aid" to --said--. |

Signed and Sealed this

Twelfth Day of April, 1994

BRUCE LEHMAN

Attest:

Attesting Officer

Commissioner of Patents and Trademarks